United States Patent
Takahashi

(10) Patent No.: US 9,444,337 B2
(45) Date of Patent: Sep. 13, 2016

(54) DCDC CONVERTER INCLUDING CLOCK GENERATION CIRCUIT, ERROR AMPLIFIER AND COMPARATOR

(71) Applicant: SEMICONDUCTOR ENERGY LABORATORY CO., LTD., Atsugi-shi, Kanagawa-ken (JP)

(72) Inventor: Kei Takahashi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 65 days.

(21) Appl. No.: 14/338,559

(22) Filed: Jul. 23, 2014

(65) Prior Publication Data

US 2015/0028837 A1    Jan. 29, 2015

(30) Foreign Application Priority Data

Jul. 26, 2013   (JP) .................... 2013-155112

(51) Int. Cl.
*G05F 1/00* (2006.01)
*H02M 3/156* (2006.01)
(Continued)

(52) U.S. Cl.
CPC ........... *H02M 3/1563* (2013.01); *H02M 3/156* (2013.01); *H02M 3/33507* (2013.01); *H02M 3/33546* (2013.01); *H01L 27/0688* (2013.01); *H01L 27/1225* (2013.01)

(58) Field of Classification Search
CPC ......... H02M 3/1563; H02M 3/33507; H02M 3/33546; H02M 3/156
USPC ........................................ 323/282, 283, 288
See application file for complete search history.

(56) References Cited

U.S. PATENT DOCUMENTS

| | | | |
|---|---|---|---|
| 5,663,675 A | * | 9/1997 | O'Shaughnessy ..... H03H 11/04 327/100 |
| 5,731,856 A | | 3/1998 | Kim et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Adolf Berhane
*Assistant Examiner* — Alex Torres-Rivera
(74) *Attorney, Agent, or Firm* — Fish & Richardson P.C.

(57) ABSTRACT

To provide a DCDC converter achieving low power consumption. A clock generation circuit, an error amplifier, a comparator, and a timer are included in a control circuit. The clock generation circuit, the error amplifier, and the comparator each include a bias circuit and a potential hold portion for intermittently holding a constant potential generated in the bias circuit. The potential hold portion includes a capacitor and a switch. The on or off of the switch is intermittently controlled using the timer. Even in a period in which the supply of voltage is stopped, a signal based on a constant potential generated in the bias circuit is continuously output.

17 Claims, 12 Drawing Sheets

(51) Int. Cl.
  *H02M 3/335* (2006.01)
  *H01L 27/06* (2006.01)
  *H01L 27/12* (2006.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,710,094 | B1 * | 5/2010 | Wong ............ H02M 3/156 323/225 |
| 7,732,819 | B2 | 6/2010 | Akimoto et al. |
| 8,324,959 | B2 * | 12/2012 | Masumoto ......... H03K 17/162 323/315 |
| 8,710,762 | B2 | 4/2014 | Takahashi et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0210092 | A1 * | 11/2003 | Mehr ............... H03F 3/005 330/9 |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0073967 | A1 * | 3/2010 | Tatsukawa ........ H02M 3/33507 363/21.18 |
| 2010/0092800 | A1 | 4/2010 | Itagaki et al. |
| 2010/0109002 | A1 | 5/2010 | Itagaki et al. |
| 2011/0175883 | A1 * | 7/2011 | Toyotaka ............. G09G 3/3648 345/211 |
| 2011/0267853 | A1 * | 11/2011 | Yang .................. H02H 7/1213 363/56.01 |
| 2012/0063204 | A1 * | 3/2012 | Kamata ............. G11C 16/0466 365/149 |
| 2012/0086422 | A1 | 4/2012 | Ito et al. |
| 2012/0153921 | A1 * | 6/2012 | Brokaw ............... H02M 3/156 323/288 |
| 2013/0187629 | A1 * | 7/2013 | Figueiredo ............ H03M 1/002 323/315 |
| 2013/0271220 | A1 | 10/2013 | Takahashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2012-019682 A | 1/2012 |
| JP | 2012-100522 A | 5/2012 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technicla Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the IN2O3 and SC2O3—A2O3—Bo Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IgZo Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J.Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 16th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor," Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

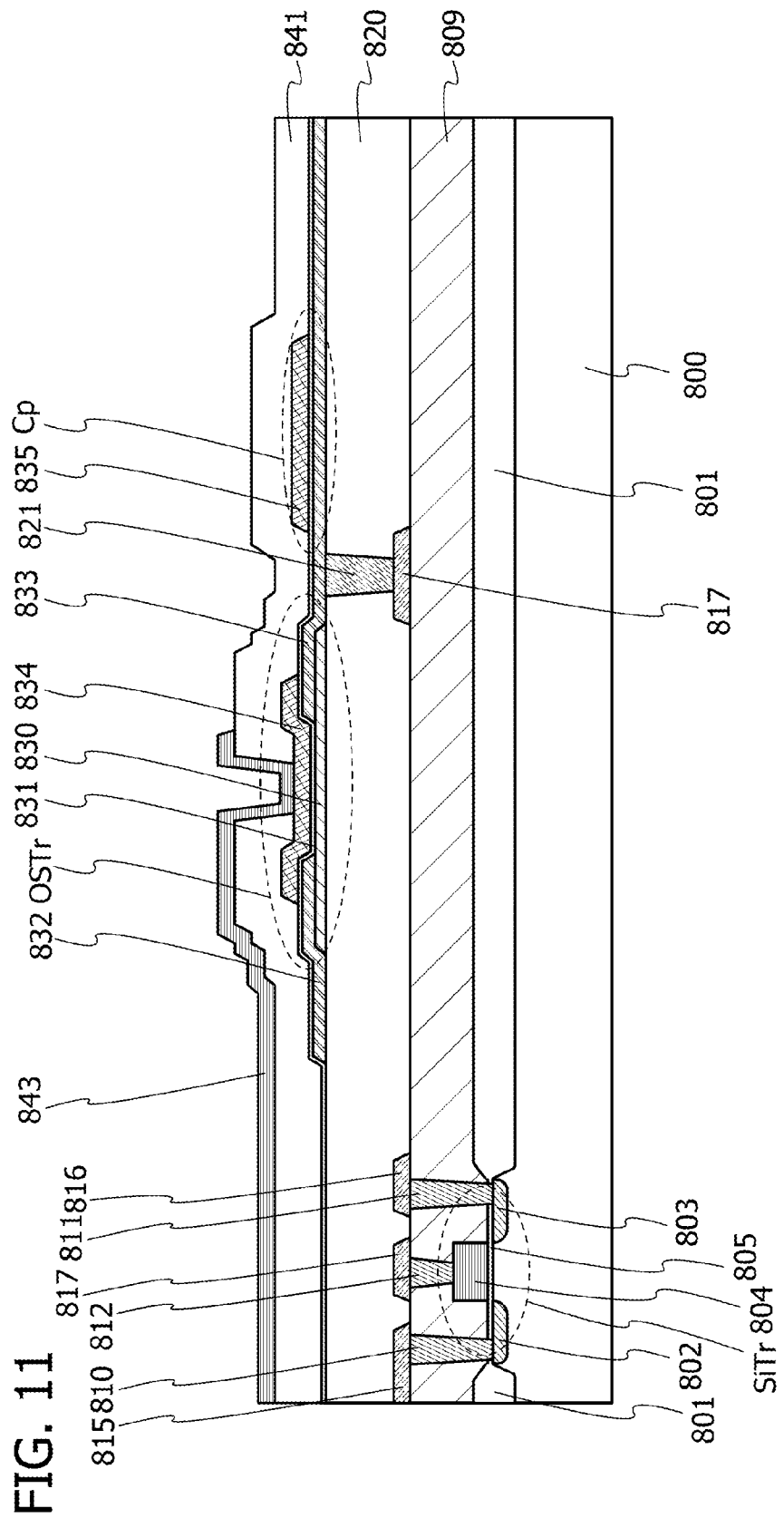

DCDC CONVERTER INCLUDING CLOCK GENERATION CIRCUIT, ERROR AMPLIFIER AND COMPARATOR

BACKGROUND OF THE INVENTION

1. Field of the Invention

The present invention relates to a semiconductor device. In particular, the present invention relates to a DCDC converter utilizing semiconductor characteristics.

2. Description of the Related Art

A DCDC converter including both a transistor containing silicon (Si) in a semiconductor layer to be a channel formation region and a transistor containing an oxide semiconductor (OS) in a semiconductor layer to be a channel formation region (the latter transistor is hereinafter referred to as "OS transistor") is proposed (see Patent Documents 1 and 2).

REFERENCE

Patent Documents

[Patent Document 1] Japanese Published Patent Application No. 2012-19682
[Patent Document 2] Japanese Published Patent Application No. 2012-100522

SUMMARY OF THE INVENTION

The DCDC converter disclosed in Patent Documents 1 and 2 includes an OS transistor as a transistor that performs power conversion by switching operation. The OS transistor has characteristics of low off-state current, and the characteristics of the OS transistor are utilized to improve power conversion efficiency of the DCDC converter.

A control circuit for performing switching operation is continuously supplied with electric power to control the transistor performing switching operation. Therefore, it cannot be said that power consumed by the control circuit is sufficiently reduced.

One object of one embodiment of the present invention is to provide a DCDC converter having a novel structure which can reduce power consumption. Another object of one embodiment of the present invention is to provide a DCDC converter having a novel structure which is capable of operating without a reduction in performance even when the supply of power to some of the circuits included in the DCDC converter is stopped.

Note that the descriptions of these objects do not disturb the existence of other objects. In one embodiment of the present invention, there is no need to achieve all the objects. Objects other than the above objects will be apparent from and can be derived from the description of the specification, the drawings, the claims, and the like.

One embodiment of the present invention relates to a DCDC converter including a voltage converter circuit that converts an input voltage to a desired voltage by switching operation and a control circuit for switching control. The control circuit includes a clock generation circuit, an error amplifier, a comparator, and a timer. The clock generation circuit, the error amplifier, and the comparator each include a bias circuit and a potential hold portion for intermittently holding a constant potential generated in the bias circuit. The potential hold portion includes a capacitor and a switch. The on or off of the switch can be intermittently controlled using the timer. The DCDC converter enables a signal based on the constant potential generated in the bias circuit to be continuously output even in a period in which power supply is stopped.

A transistor with extremely low off-state current is used as the switch in the potential hold portion. A transistor in which a channel is formed in an oxide semiconductor film can be used as the transistor with extremely low off-state current. When the transistor in which a channel is formed in an oxide semiconductor film is used as a switch, even in the case where a potential of a node to which the switch and the capacitor are connected is kept constant and then the switch is turned off, the amount of electric charges leaking through the switch can be extremely small.

In the potential hold portion, by turning off the switch, the constant potential generated in the bias circuit can be held at the node to which the switch and the capacitor are connected. This eliminates the need for continuous output of the constant potential generated in the bias circuit, and therefore, the bias circuit is not required to be operated at all times. Thus, the supply of power to the bias circuit can be stopped, and accordingly, power consumed by the bias circuit can be reduced.

One embodiment of the present invention is a DCDC converter including a voltage converter circuit having a transistor, and a control circuit for controlling the transistor. The control circuit includes a clock generation circuit, an error amplifier, a comparator, and a timer. The clock generation circuit, the error amplifier, and the comparator each include a bias circuit, and a potential hold portion for holding a constant potential generated in the bias circuit. The potential hold portion includes a capacitor and a switch capable of being intermittently turned on or off using the timer.

In the DCDC converter of one embodiment of the present invention, the timer is preferably a circuit for performing control so as to stop supply of power to the bias circuit in a period in which the switch is off.

In the DCDC converter of one embodiment of the present invention, the control circuit preferably includes a band gap reference circuit, a reference bias generation circuit, and a reference voltage generation circuit, and the timer is preferably a circuit for performing control so that a signal output from the band gap reference circuit, the reference bias generation circuit, and the reference voltage generation circuit is stopped in a period in which the switch is off.

In the DCDC converter of one embodiment of the present invention, the switch is preferably a transistor in which an oxide semiconductor is used for a semiconductor layer to be a channel formation region.

In the DCDC converter of one embodiment of the present invention, the voltage converter circuit is preferably a circuit of a non-isolated step-up choke type, a non-isolated step-down choke type, an isolated forward type, an isolated flyback type, a half-bridge type, or a full-bridge type.

One embodiment of the present invention can provide a DCDC converter having a novel structure which can reduce power consumption. One embodiment of the present invention can provide a DCDC converter having a novel structure which can operate without a reduction in performance even when the supply of power to some of the circuits included in the DCDC converter is stopped.

BRIEF DESCRIPTION OF THE DRAWINGS

FIG. 11 is a cross-sectional view according to one embodiment of the present invention.

DETAILED DESCRIPTION OF THE INVENTION

Figure 1A:
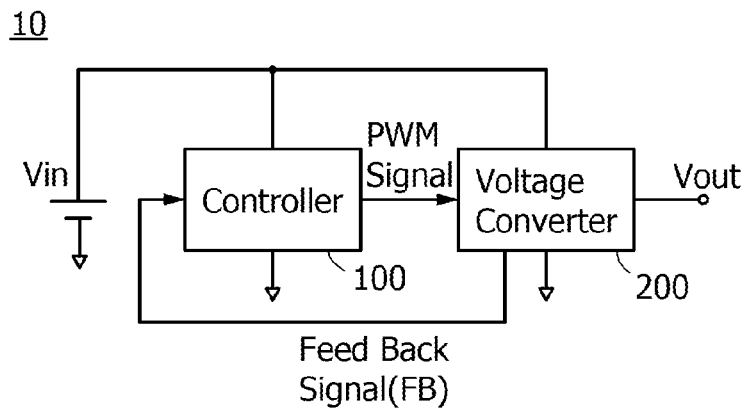
FIGS. 1A and 1B are block diagrams according to one embodiment of the present invention.

Hereinafter, embodiments will be described with reference to drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments. Note that in structures of the present invention described below, reference numerals denoting the same portions are used in common in different drawings.

In the reference drawings, the size, the thickness of layers, or regions may be exaggerated for clarity in some cases. Therefore, embodiments of the present invention are not limited to such a scale. Note that drawings are schematic views of ideal examples, and the embodiments of the present invention are not limited to the shape or the value illustrated in the drawings. For example, variation in signal, voltage, or current due to noise or a difference in timing can be included.

In this specification and the like, a transistor is an element having at least three terminals: a gate, a drain, and a source. The transistor has a channel region between the drain (a drain terminal, a drain region, or a drain electrode) and the source (a source terminal, a source region, or a source electrode), and current can flow through the drain, the channel region, and the source.

Here, since the source and the drain of the transistor may change depending on a structure, operating conditions, and the like of the transistor, it is difficult to define which is a source or a drain. Thus, it is possible that a portion functioning as the source and a portion functioning as the drain are not called a source and a drain, and that one of the source and the drain is referred to as a first electrode and the other is referred to as a second electrode.

In this specification and the like, ordinal numbers such as first, second, and third are used in order to avoid confusion among components, and the terms do not limit the components numerically.

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

In this specification and the like, terms for describing arrangement, such as "over" and "under", are used for convenience to indicate a positional relation between components with reference to drawings. Further, the positional relation between components is changed as appropriate in accordance with a direction in which each component is described. Thus, there is no limitation on terms used in this specification, and description can be made appropriately depending on the situation.

In this specification and the like, the layout of circuit blocks in drawings specifies the positional relation for description. Thus, even when a drawing shows that different functions are achieved in different circuit blocks, an actual circuit or region may be configured so that the different functions are achieved in the same circuit or region. Further, the function of each circuit block in a drawing is specified for description. Thus, even when one circuit block is illustrated, an actual circuit or region may be configured so that processing which is illustrated as being performed in the one circuit block is performed in a plurality of circuit blocks.

In this specification and the like, voltage often refers to a potential difference between a given potential and a reference potential (e.g., a ground potential). Accordingly, the voltage, the potential, and the potential difference can also be referred to as a potential, a voltage, and a voltage difference, respectively. Note that a voltage refers to a difference between potentials of two points, and a potential refers to electrostatic energy (electric potential energy) of a unit electric charge at a given point in an electrostatic field.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification and the like, the trigonal and rhombohedral crystal systems are included in the hexagonal crystal system.

(Embodiment 1)

In this embodiment, a circuit configuration of a DCDC converter and an operation thereof are described.

Note that a DCDC converter is a circuit utilizing semiconductor characteristics. Therefore, a DCDC converter is also referred to as a semiconductor device. Here, a semiconductor device means a device including a semiconductor element. The semiconductor device includes a driver circuit for driving a circuit including a semiconductor element, for example.

FIG. 1A illustrates an example of a DCDC converter.

A DCDC converter 10 illustrated in FIG. 1A includes a control circuit 100 (abbreviated to "Controller" in drawings) and a voltage converter circuit 200 (abbreviated to "Voltage Converter" in drawings).

The DCDC converter 10 is a circuit for converting an input voltage Vin to an output voltage Vout. The input voltage Vin is preferably a direct-current voltage. In the case where the input voltage Vin is an alternating voltage, it is preferable that the alternating voltage be converted to a direct-current voltage and the direct-current voltage be supplied to the DCDC converter 10.

The control circuit 100 outputs a pulse width control signal (abbreviated to "PWM Signal" in drawings) for controlling on or off of a transistor serving as a switch included in the voltage converter circuit 200. The control circuit 100 is supplied with the input voltage Vin and a feedback signal (referred to as "Feed Back Signal (FB)" in drawings) from the voltage converter circuit 200 and outputs the pulse width control signal. Note that in a structure of this embodiment, pulse-width modulation is used; alternatively, pulse-frequency modulation (PFM) may be used.

The voltage converter circuit 200 includes the transistor serving as a switch and converts the input voltage Vin to the output voltage Vout by switching on or off of the transistor. The output voltage Vout is obtained by stepping up or stepping down the input voltage Vin. The voltage converter circuit 200 in this embodiment may have a circuit configuration which steps up the input voltage Vin or steps down the input voltage Vin. Note that the transistor serving as a switch is preferably a transistor including single crystal silicon or SiC to enable high-speed switching operation; alternatively, a transistor including another semiconductor material may be used.

Figure 1B:
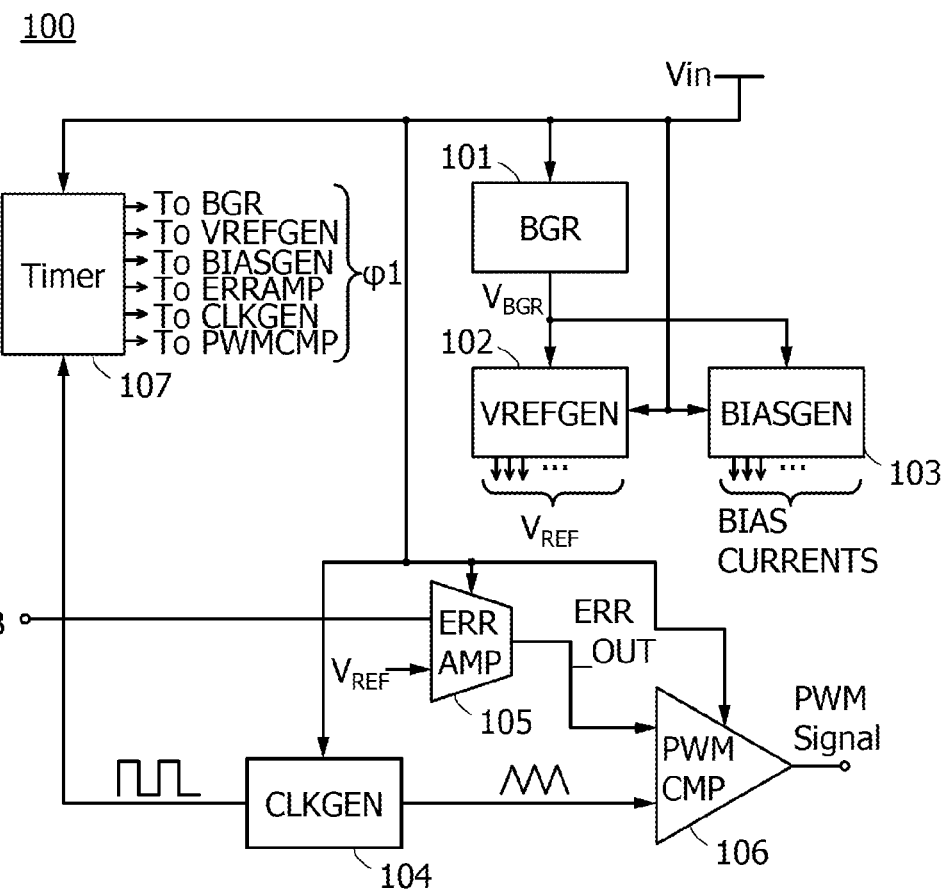

FIG. 1B illustrates an example of a block diagram of the control circuit 100 illustrated in FIG. 1A.

The control circuit 100 illustrated in FIG. 1B includes a band gap reference circuit 101 (abbreviated to "BGR" in drawings), a reference voltage generation circuit 102 (abbreviated to "VREFGEN" in drawings), a reference bias generation circuit 103 (abbreviated to "BIASGEN" in drawings), a clock generation circuit 104 (abbreviated to "CLKGEN" in drawings), an error amplifier 105 (abbreviated to "ERRAMP" in drawings), a comparator 106 (abbreviated to "PWMCMP" in drawings), and a timer 107 (referred to as "Timer" in drawings).

The band gap reference circuit 101 is a circuit having a function of generating a reference voltage $V_{BGR}$ in accordance with the input voltage Vin. The reference voltage $V_{BGR}$ is used for operating the reference voltage generation circuit 102 and the reference bias generation circuit 103. Note that in the band gap reference circuit 101, the generation of the reference voltage $V_{BGR}$ can be stopped in accordance with a mode switching signal (abbreviated to "ϕ1" in drawings) that is output from the timer 107. Note that in order to stop the supply of the input voltage Vin, the following structure may be used: a potential is applied to a gate of a transistor in the band gap reference circuit 101 so that the transistor is not operated, and thus, the reference voltage $V_{BGR}$ is stopped.

The reference voltage generation circuit 102 is a circuit having a function of generating a reference voltage $V_{REF}$ in accordance with the reference voltage $V_{BGR}$. The reference voltage $V_{REF}$ is used in the control circuit 100. The reference voltage $V_{REF}$ is supplied to the error amplifier 105, for example. Note that the reference voltage generation circuit 102 is supplied with the input voltage Vin, and the generation of the reference voltage $V_{REF}$ can be stopped in accordance with the mode switching signal which is output from the timer 107. Note that in order to stop the supply of the input voltage Vin, the following structure may be used: a potential is applied to a gate of a transistor in the reference voltage generation circuit 102 so that the transistor is not operated, and thus, the reference voltage $V_{REF}$ is stopped.

The reference bias generation circuit 103 is a circuit having a function of generating bias currents (referred to as "BIAS CURRENTS" in drawings) in accordance with the reference voltage $V_{BGR}$. The bias currents are used in the control circuit 100. The bias currents are supplied to the clock generation circuit 104, the error amplifier 105, and the comparator 106, for example. Note that the reference bias generation circuit 103 is supplied with the input voltage Vin, and the generation of the bias currents can be stopped in accordance with the mode switching signal output from the timer 107. Note that in order to stop the supply of the input voltage Vin, the following structure may be used: a potential is applied to a gate of a transistor in the reference bias generation circuit 103 so that the transistor is not operated, and thus, the bias currents are stopped.

The clock generation circuit 104 is a circuit to which the bias current and the input voltage Vin are supplied. The clock generation circuit 104 has a function of generating a clock signal and a triangle wave that are used in the control circuit 100. The clock generation circuit 104 includes a bias circuit, a reference clock generation circuit, and a potential hold portion, for example. The bias circuit generates a bias voltage having a constant potential in accordance with the bias current. The reference clock generation circuit generates a clock signal and a triangle wave in accordance with the bias voltage. The potential hold portion includes a capacitor and a switch. The on or off of the switch is intermittently controlled using the timer 107, so that the bias voltage can be held in accordance with the mode switching signal output from the timer 107. Thus, even when the function of the bias circuit is stopped, the bias voltage can be continuously supplied to the reference clock generation circuit.

Note that the input voltage Vin is supplied to the clock generation circuit 104, and the supply of the input voltage Vin to the bias circuit in the clock generation circuit 104 can be stopped in accordance with the mode switching signal output from the timer 107, so that the generation of the bias voltage can be stopped. Note that in order to stop the supply of the input voltage Vin to the bias circuit, a switch for power gating may be provided in the bias circuit to turn the switch on or off.

The error amplifier 105 is a circuit to which the bias current and the input voltage Vin are supplied. The error amplifier 105 has a function of generating an error signal (abbreviated to ERR_OUT in drawings) obtained by amplifying a difference between the potential of the feedback signal and the reference voltage $V_{REF}$. The error amplifier 105 includes an operational amplifier (op-amp) and an operational trans-conductance amplifier (OTA), for example.

The operational amplifier includes a bias circuit, a voltage amplifier circuit, and a potential hold portion, for example. The bias circuit generates a bias voltage having a constant potential in accordance with the bias current. The voltage amplifier circuit amplifies the difference between the potential of the input feedback signal and the input reference voltage $V_{REF}$ in accordance with the bias voltage, and outputs the amplified signal. The potential hold portion includes a capacitor and a switch. The on or off of the switch is intermittently controlled using the timer 107, so that the bias voltage can be held in accordance with the mode switching signal output from the timer 107. Thus, even when the function of the bias circuit is stopped, the bias voltage can be continuously supplied to the voltage amplifier circuit.

The operational trans-conductance amplifier includes a bias circuit, a voltage amplifier circuit, and a potential hold portion, for example. The bias circuit generates a bias voltage having a constant potential in accordance with the bias current. The voltage amplifier circuit amplifies the difference between the potential of the feedback signal and the reference voltage $V_{REF}$ that are input, in accordance with the bias voltage, and outputs the amplified signal. The potential hold portion includes a capacitor and a switch. The on or off of the switch is intermittently controlled using the timer 107, so that the bias voltage can be held in accordance with the mode switching signal output from the timer 107. Thus, even when the function of the bias circuit is stopped, the bias voltage can be continuously supplied to the voltage amplifier circuit.

Note that the input voltage Vin is supplied to the operational amplifiers and the operational trans-conductance amplifier of the error amplifier 105, and the supply of the input voltage Vin to the bias circuits in the operational amplifiers and the operational trans-conductance amplifier can be stopped in accordance with the mode switching signal output from the timer 107, so that the generation of the bias voltage can be stopped. Note that in order to stop the supply of the input voltage Vin to the bias circuits, a switch for power gating may be provided between the bias circuit and the wiring for applying the input voltage Vin to turn the switch on or off.

The comparator 106 is a circuit to which the error signal and the triangle wave are supplied. The comparator 106 has a function of generating a pulse width control signal for controlling on or off of the transistor serving as a switch in the voltage converter circuit 200. The comparator 106 includes a bias circuit, a comparison circuit, and a potential hold portion, for example. The bias circuit generates a bias voltage having a constant potential in accordance with the bias current. The comparison circuit compares the potential of the error signal and the potential of the triangle wave in accordance with the bias voltage, and generates a signal using the magnitude relation obtained by the comparison in accordance with the bias voltage. The potential hold portion includes a capacitor and a switch. The on or off of the switch is intermittently controlled using the timer 107, so that the bias voltage can be held in accordance with the mode switching signal output from the timer 107. Thus, even when the function of the bias circuit is stopped, the bias voltage can be continuously supplied to the comparison circuit.

Note that the input voltage Vin is supplied to the comparator 106, and the supply of the input voltage Vin to the bias circuit in the comparator 106 can be stopped in accordance with the mode switching signal output from the timer 107, so that the generation of the bias voltage can be stopped. Note that in order to stop the supply of the input voltage Vin to the bias circuit, a switch for power gating may be provided between the bias circuit and the wiring for applying the input voltage Vin to turn the switch on or off.

The timer 107 is a circuit having a function of outputting a mode switching signal for switching a state every specified period of time to the band gap reference circuit 101, the reference voltage generation circuit 102, the reference bias generation circuit 103, the clock generation circuit 104, the error amplifier 105, and the comparator 106. The mode switching signal is a signal for switching between a first mode and a second mode. The mode switching signal is generated such that, for example, the wave number of the clock signal generated in the clock generation circuit 104 every specified period of time is counted using a counter or the like to switch mode.

Mode may be switched to the first mode by changing the level of the mode switching signal to a high level. In the first mode, the switches of the potential hold portions included in the clock generation circuit 104, the error amplifier 105, and the comparator 106 are turned on so that the bias voltage is applied to the potential hold portions. In the first mode, the switches for power gating may be turned on to supply the input voltage Vin to the bias circuits included in the clock generation circuit 104, the error amplifier 105, and the comparator 106. In the first mode, the switches for power gating may be turned on to supply the input voltage Vin to the band gap reference circuit 101, the reference voltage generation circuit 102, and the reference bias generation circuit 103. The first mode is also referred to as a sampling mode.

Figure 2A:
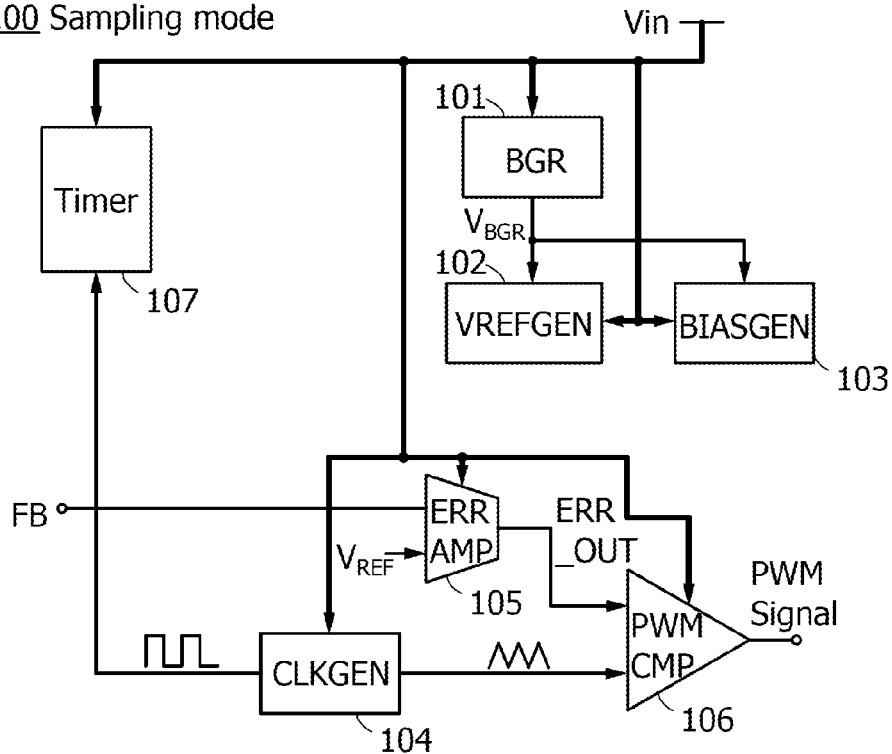
FIGS. 2A and 2B are block diagrams according to one embodiment of the present invention.

FIG. 2A is a block diagram visualizing the state of supply of the input voltage Vin in the first mode in the control circuit 100 illustrated in FIG. 1B. A thick solid arrow in FIG. 2A indicates that the input voltage Vin is supplied to a circuit.

Mode may be switched to the second mode by changing the level of the mode switching signal to a high level. In the second mode, the switches of the potential hold portions included in the clock generation circuit 104, the error amplifier 105, and the comparator 106 are turned on so that the bias voltage is applied to the potential hold portions. In the second mode, the switches for power gating may be turned on to supply the input voltage Vin to the bias circuits included in the clock generation circuit 104, the error amplifier 105, and the comparator 106. In the second mode, the switches for power gating may be turned on to supply the input voltage Vin to the band gap reference circuit 101, the reference voltage generation circuit 102, and the reference bias generation circuit 103. The second mode is also referred to as a hold mode.

Figure 2B:
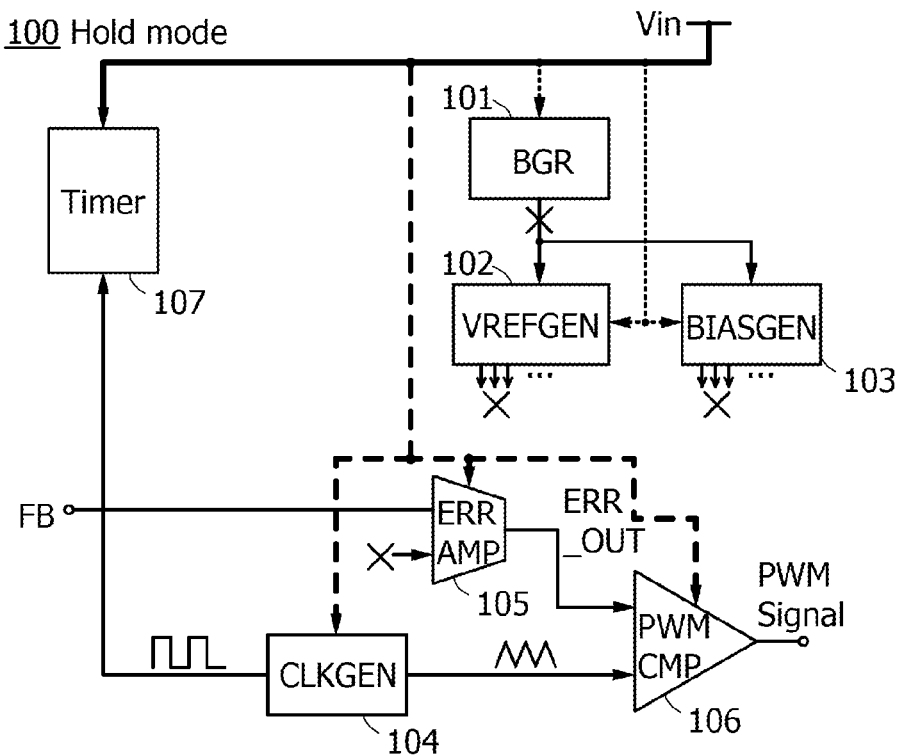

FIG. 2B is a block diagram visualizing the state of supply of the input voltage Vin in the second mode in the control circuit 100 illustrated in FIG. 1B. A thick solid arrow in FIG. 2B indicates that the input voltage Vin is supplied to a circuit. A thick dotted arrow in FIG. 2B indicates that the input voltage Vin is partially supplied to a circuit. A thin dotted arrow in FIG. 2B indicates that the supply of the input voltage Vin to a circuit is stopped. A cross mark in FIG. 2B indicates that the supply of a signal from a circuit is stopped.

With the use of the above-described structure, switching between sampling and holding of a potential can be intermittently controlled in the potential hold portions included in the clock generation circuit 104, the error amplifier 105, and the comparator 106, in accordance with the mode switching signal output from the timer 107. The switching between the first mode and the second mode can be realized by controlling on or off of the switches included in the potential hold portions. Note that each of the potential hold portions can hold the bias voltage having a constant potential that is generated in the bias circuit, whereby a circuit in the next stage can continuously output a signal even in a period in which the supply of power to the bias circuit is stopped. Thus, the use of the control circuit of the DCDC converter having the structure of this embodiment achieves a DCDC converter capable of reducing power consumption. Furthermore, the use of the control circuit of the DCDC converter having the structure of this embodiment enables the DCDC converter to operate without a reduction in performance even when the supply of power to some of the circuits in the control circuit is stopped.

To describe the structures of the potential hold portions included in the clock generation circuit 104, the error amplifier 105, and the comparator 106, specific examples of circuit configurations of the circuits are described below.

Figure 3:
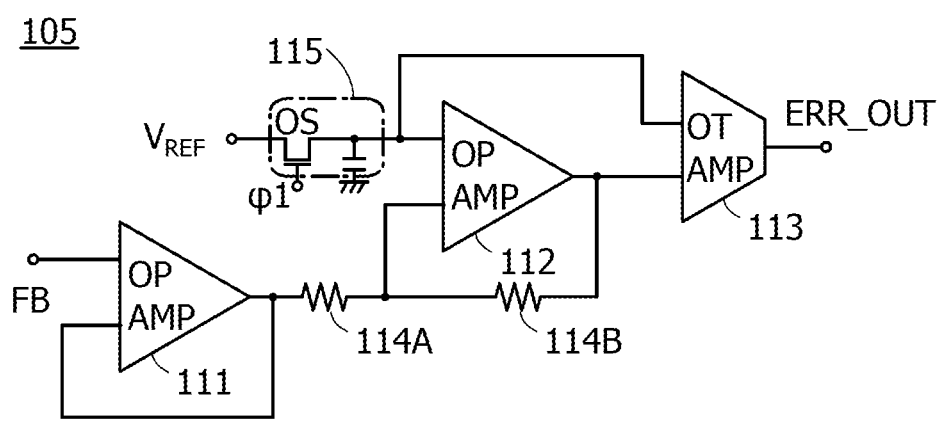
FIG. 3 is a block diagram according to one embodiment of the present invention.

FIG. 3 illustrates an example of a circuit configuration of the error amplifier 105. The error amplifier 105 illustrated in FIG. 3 includes an operational amplifier 111, an operational amplifier 112, an operational trans-conductance amplifier 113, a resistor 114A, a resistor 114B, and a potential hold portion 115.

A feedback signal and an output signal for negative feedback are supplied to input terminals of the operational amplifier 111, and an output signal is output from an output terminal of the operational amplifier 111. The reference voltage $V_{REF}$ is supplied to an input terminal of the operational amplifier 112, and the signal output from the operational amplifier 111 is supplied to another input terminal of the operational amplifier 112 via the resistor 114A. An output signal is output from an output terminal of the operational amplifier 112. The signal output from the operational amplifier 112 is fed back negatively, via the resistor 114B, to the input terminal of the operational amplifier 112 to which the signal output from the operational amplifier 111 is supplied. The reference voltage $V_{REF}$ is supplied to an input terminal of the operational trans-conductance amplifier 113, and the signal output from the operational amplifier 112 is supplied to another input terminal of the operational trans-conductance amplifier 113. An error signal is output from an output terminal of the operational trans-conductance amplifier 113.

The potential hold portion 115 includes a transistor serving as a switch and a capacitor. A gate of the transistor serving as a switch is supplied with the mode switching signal, whereby on or off of the transistor can be controlled.

A transistor with extremely low off-state current is used as the transistor serving as a switch. A transistor in which a channel is formed in an oxide semiconductor film can be used as the transistor with extremely low off-state current.

Note that low off-state current means that a normalized off-state current per micrometer in channel width at room temperature is lower than or equal to 10 zA/μm. Since the off-state current is preferably as low as possible, the value of the normalized off-state current is preferably lower than or equal to 1 zA/μm, more preferably lower than or equal to 10 yA/μm, still more preferably lower than or equal to 1 yA/μm. Note that voltage between a source and a drain in that case is, for example, approximately 0.1 V, 5 V, or 10 V.

In the first mode, the transistor serving as a switch is on in accordance with the mode switching signal. In the second mode, the transistor serving as a switch is off in accordance with the mode switching signal. When a transistor whose channel is formed in an oxide semiconductor film is used as a switch, even in the case where a potential of a node to which the switch and the capacitor are connected is kept constant and then the switch is turned off, the amount of electric charges leaking through the switch can be extremely small.

Thus, in the potential hold portion 115, by turning off the switch, the reference voltage $V_{REF}$ generated in the reference voltage generation circuit 102 can be held at the node to which the switch and the capacitor are connected.

Note that in this specification, the OS transistor is a transistor in which an oxide semiconductor is used in a semiconductor layer to be a channel formation region. To indicate this, the word "OS" is added.

Note that the capacitor included in the potential hold portion 115 is connected to a ground line, and one electrode of the capacitor may be connected to a wiring to which a constant potential is applied. The capacitor is not necessarily provided when a parasitic capacitance or a gate capacitance of the transistor is used.

Figure 4A:
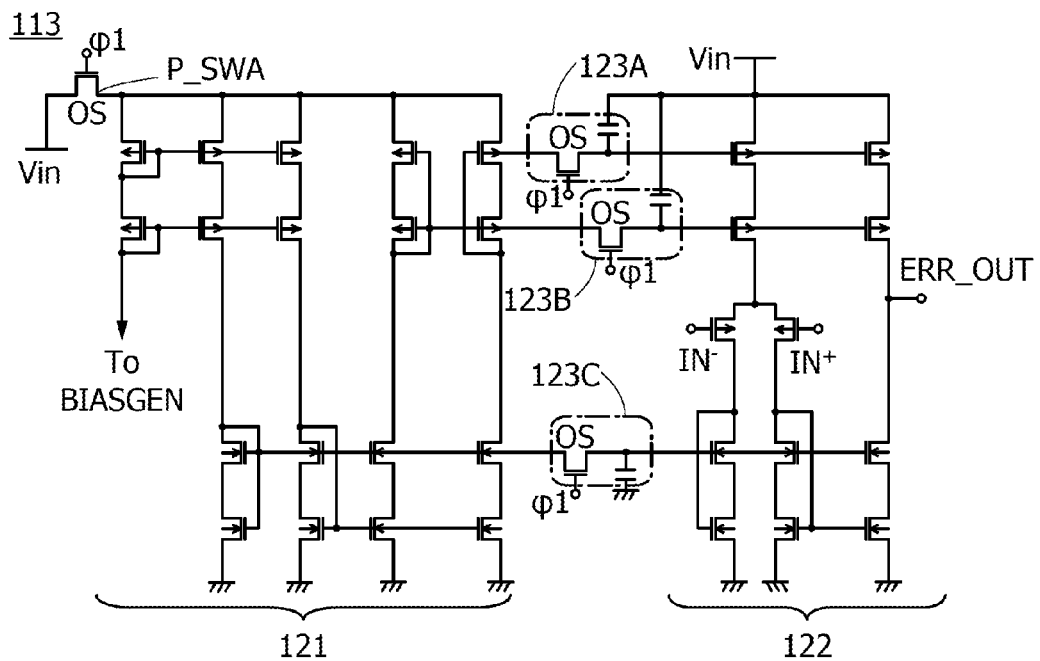
FIGS. 4A and 4B are circuit diagrams according to one embodiment of the present invention.

FIG. 4A illustrates a specific example of a circuit configuration of the operational trans-conductance amplifier 113. The operational trans-conductance amplifier 113 includes a bias circuit 121, an amplifier circuit 122, potential hold portions 123A to 123C, and a power switch P_SWA.

The bias circuit 121 is a circuit having a function of generating bias voltages, which are constant voltages and used in the amplifier circuit 122, in accordance with the bias current supplied from the reference bias generation circuit 103. Note that the bias voltages are obtained by feeding a current to a plurality of transistors to which the input voltage Vin is applied. The plurality of voltages are applied as bias voltages to gates of transistors included in the amplifier circuit 122 via the potential hold portions 123A to 123C. Note that the bias circuit 121 may be formed using a current-mirror circuit.

The amplifier circuit 122 is a circuit having a function of outputting an error signal obtained by amplifying a feedback signal. A signal is input to an input terminal IN⁺ and an input terminal IN⁻ with the bias voltages applied to the gates of the transistors via the potential hold portions 123A to 123C, so that the error signal is output from the amplifier circuit 122. Note that the amplifier circuit 122 may be formed using a differential amplifier circuit and a current-mirror circuit.

The potential hold portions 123A to 123C each include a transistor serving as a switch and a capacitor. The mode switching signal is supplied to a gate of the transistor serving as a switch, whereby on or off of the transistor can be controlled.

The power switch P_SWA includes a transistor serving as a power switch. The mode switching signal is supplied to a gate of the transistor serving as a power switch, whereby on or off of the transistor can be controlled.

In each of the potential hold portions 123A to 123C, by turning off the switch, a constant potential generated in the bias circuit 121 can be held at the node to which the switch and the capacitor are connected. Such a structure eliminates the need for continuously outputting the constant potential generated in the bias circuit 121, and thus, the operation of the bias circuit 121 can be stopped by turning off the power switch P_SWA. Therefore, the supply of power to the bias circuit can be stopped without stopping the operation of the operational trans-conductance amplifier 113; accordingly, in the operational trans-conductance amplifier 113, power consumption of the bias circuit 121 can be reduced.

Note that the capacitor included in each of the potential hold portions 123A to 123C is connected to a ground line or a wiring to which the input voltage Vin is supplied. One electrode of the capacitor may be connected to a wiring having a constant potential. The capacitor is not necessarily provided when a parasitic capacitance or a gate capacitance of the transistor is used.

The transistors included in the bias circuit 121 and the amplifier circuit 122 are preferably transistors in each of which silicon (Si) is used for a semiconductor layer to be a channel formation region. With such a structure, the amount of current flowing in the transistors can be increased, achieving high-speed circuit operation.

Figure 4B:
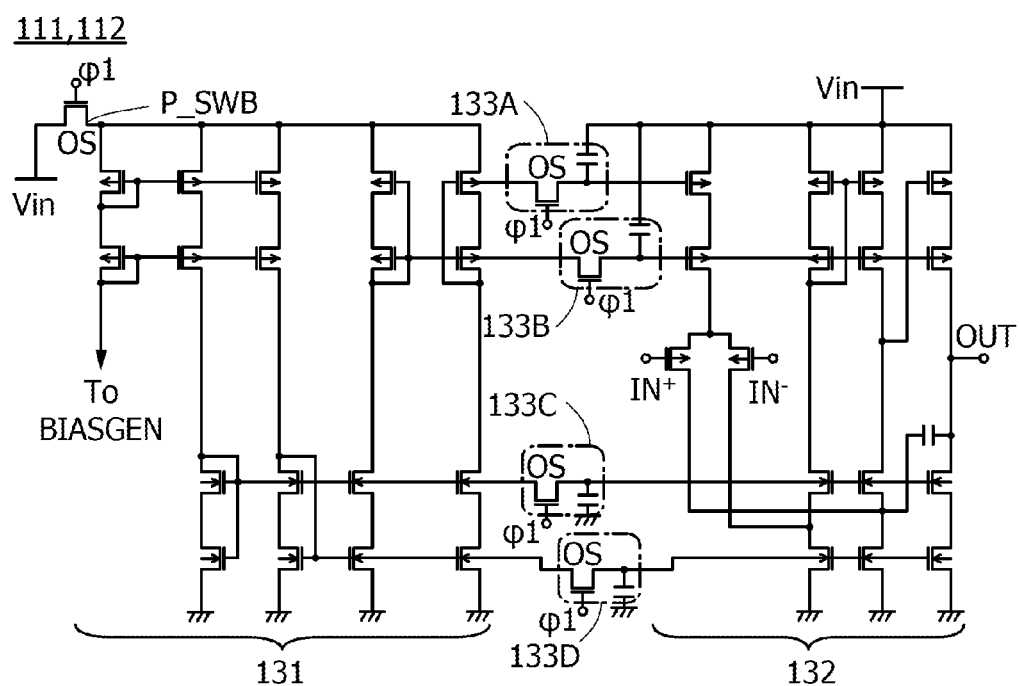

FIG. 4B illustrates a specific example of a circuit configuration of each of the operational amplifiers 111 and 112. The operational amplifiers 111 and 112 each include a bias circuit 131, a voltage amplifier circuit 132, potential hold portions 133A to 133D, and a power switch P_SWB.

The bias circuit 131 is a circuit having a function of generating bias voltages, which are constant voltages and used in the voltage amplifier circuit 132, in accordance with the bias current supplied from the reference bias generation circuit 103. Note that the bias voltages are obtained by feeding a current to a plurality of transistors to which the input voltage Vin is applied. The plurality of voltages are applied as bias voltages to gates of transistors included in the voltage amplifier circuit 132 via the potential hold portions 133A to 133C. Note that the bias circuit 131 may be formed using a current-mirror circuit.

The voltage amplifier circuit 132 is a circuit having a function of outputting an output signal OUT by inputting a signal to an input terminal IN and an input terminal IN⁻ with the bias voltages applied to the gates of the transistors via the potential hold portions 133A to 133C. Note that the voltage amplifier circuit 132 may be formed using a differential amplifier circuit and a current-mirror circuit.

The potential hold portions 133A to 133D each include a transistor serving as a switch and a capacitor, like the potential hold portions 123A to 123C. The power switch P_SWB includes a transistor serving as a switch, like the power switch P_SWA.

In each of the potential hold portions 133A to 133D, by turning off the switch, a constant potential generated in the bias circuit 131 can be held at the node to which the switch and the capacitor are connected. Such a structure eliminates the need for continuously outputting the constant potential generated in the bias circuit 131, and thus, the operation of the bias circuit 131 can be stopped by turning off the power switch P_SWB. Therefore, the supply of power to the bias circuit can be stopped without stopping the operation of the operational amplifiers 111 and 112; accordingly, in each of the operational amplifiers 111 and 112, power consumption of the bias circuit 131 can be reduced.

The transistors included in the bias circuit 131 and the voltage amplifier circuit 132 are preferably transistors in each of which silicon (Si) is used for a semiconductor layer to be a channel formation region. With such a structure, the amount of current flowing in the transistors can be increased, achieving high-speed circuit operation.

Figure 5:
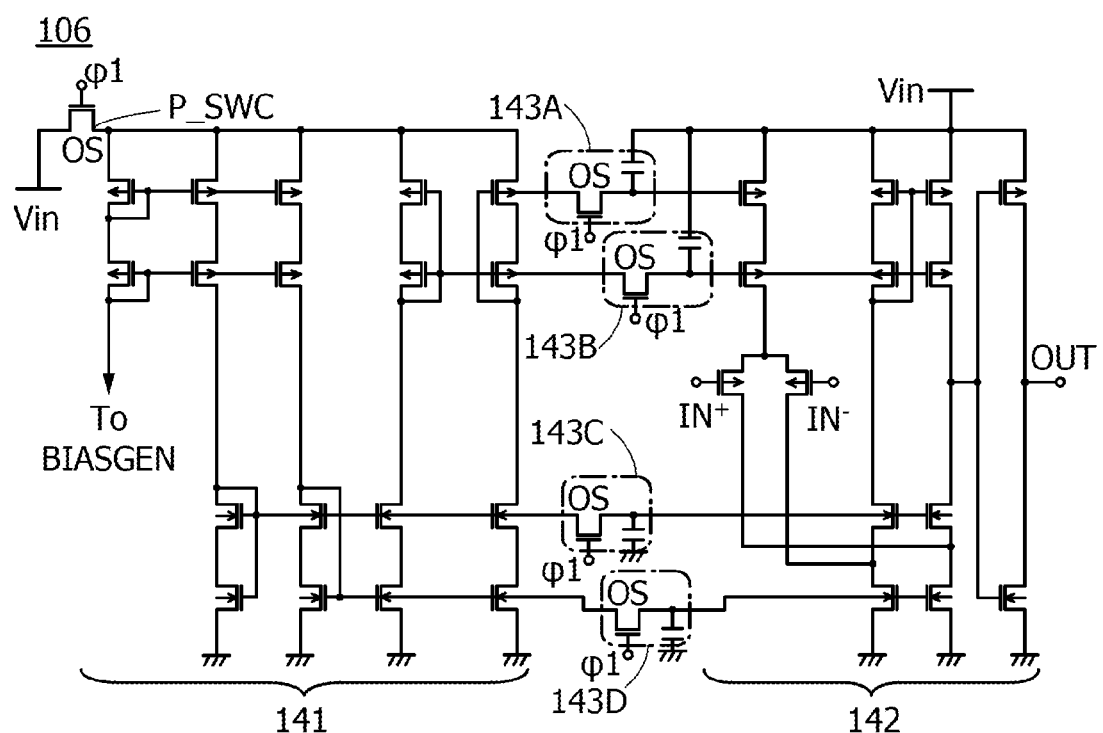
FIG. 5 is a circuit diagram according to one embodiment of the present invention.

FIG. 5 illustrates a specific example of a circuit configuration of the comparator 106. The comparator 106 includes a bias circuit 141, a comparison circuit 142, potential hold portions 143A to 143D, and a power switch P_SWC.

The bias circuit 141 is a circuit having a function of generating bias voltages, which are constant voltages and used in the comparison circuit 142, in accordance with the bias current supplied from the reference bias generation circuit 103. Note that the bias voltages are obtained by feeding a current to a plurality of transistors to which the input voltage Vin is applied. The plurality of voltages are applied as bias voltages to gates of transistors included in the comparison circuit 142 via the potential hold portions 143A to 143C. Note that the bias circuit 141 may be formed using a current-mirror circuit.

The comparison circuit 142 is a circuit having a function of outputting an output signal OUT by inputting a signal to an input terminal IN and an input terminal IN⁻ with a bias voltage applied to gates of transistors via the potential hold portions 143A to 143D. Note that the comparison circuit 142 may be formed of a differential amplifier circuit and a current-mirror circuit.

The potential hold portions 143A to 143D each include a transistor serving as a switch and a capacitor, like the potential hold portions 123A to 123C. The power switch P_SWC includes a transistor serving as a switch, like the power switch P_SWA.

In each of the potential hold portions 143A to 143D, by turning off the switch, a constant potential generated in the bias circuit 141 can be held at the node to which the switch and the capacitor are connected. Such a structure eliminates the need for continuously outputting the constant potential generated in the bias circuit 141, and thus, the operation of the bias circuit 141 can be stopped by turning off the power switch P_SWC. Therefore, the supply of power to the bias circuit 141 can be stopped without stopping the operation of the comparator 106; thus, the comparator 106 can operate without a reduction in performance, and power consumption of the bias circuit 141 in the comparator 106 can be reduced.

The transistors included in the bias circuit 141 and the comparison circuit 142 are preferably transistors in each of which silicon (Si) is used for a semiconductor layer to be a channel formation region. With such a structure, the amount of current flowing in the transistors can be increased, achieving high-speed circuit operation.

Figure 6:
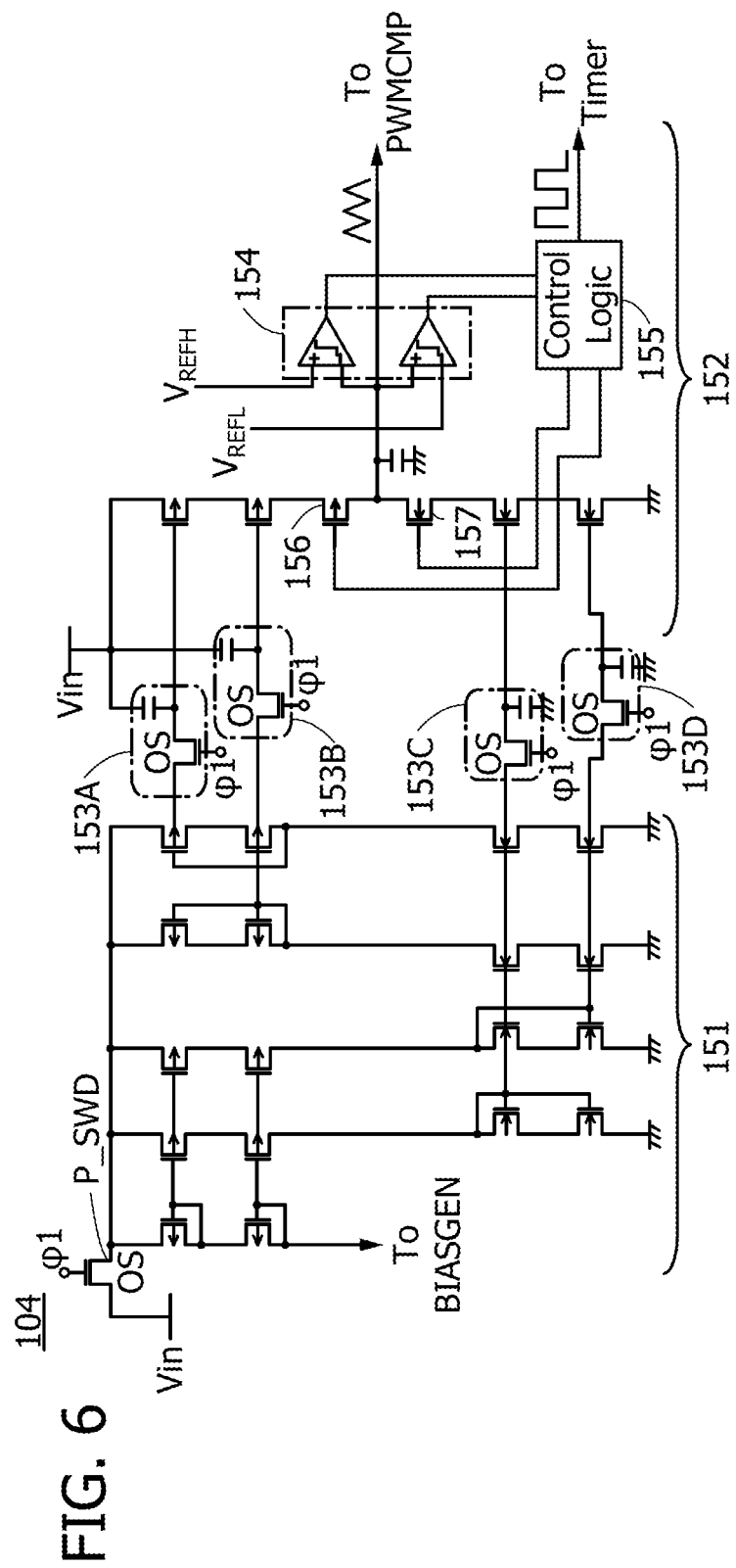
FIG. 6 is a circuit diagram according to one embodiment of the present invention.

FIG. 6 illustrates a specific example of a circuit configuration of the clock generation circuit 104. The clock generation circuit 104 includes a bias circuit 151, a clock generation portion 152, potential hold portions 153A to 153D, and a power switch P_SWD.

The bias circuit 151 is a circuit having a function of generating bias voltages, which are constant voltages and used in the clock generation portion 152, in accordance with the bias current supplied from the reference bias generation circuit 103. Note that the bias voltages are obtained by feeding a current to a plurality of transistors to which the input voltage Vin is applied. The plurality of voltages are applied as bias voltages to gates of transistors included in the clock generation portion 152 via the potential hold portions 153A to 153D. Note that the bias circuit 151 may be formed using a current-mirror circuit.

The clock generation portion 152 includes a comparison circuit 154, a control logic circuit 155 (abbreviated to "Control Logic" in the drawing), and transistors 156 and 157 serving as switches. In the clock generation portion 152, on or off of the transistors 156 and 157 is alternately selected by the control logic circuit 155 with bias voltages applied to gates of transistors via the potential hold portions 153A to 153D so that an increase and a decrease in voltage is performed at a constant speed. In the clock generation portion 152, the voltage that increases and decreases at a constant speed is compared with a reference voltage $V_{REFH}$, and the voltage that increases and decreases at a constant speed is compared with a reference voltage $V_{REFL}$. The comparisons are performed using the comparison circuit 154. The control logic circuit 155 controls on or off of the transistors 156 and 157 using the comparison results obtained by the comparison circuit 154, and the voltage that increases and decreases at a constant speed is shaped into the form of a triangle wave. The control logic circuit 155 can generate a clock signal in synchronization with the triangle wave.

The potential hold portions 153A to 153D each include a transistor serving as a switch and a capacitor, like the potential hold portions 123A to 123C. The power switch P_SWD includes a transistor serving as a switch, like the power switch P_SWA.

In each of the potential hold portions 153A to 153D, by turning off the switch, a constant potential generated in the bias circuit 151 can be held at the node to which the switch and the capacitor are connected. Such a structure eliminates the need for continuously outputting the constant potential generated in the bias circuit 151, and thus, the operation of the bias circuit 151 can be stopped by turning off the power switch P_SWD. Therefore, the supply of power to the bias circuit can be stopped without stopping the operation of the clock generation portion 152; accordingly, in the clock generation circuit 104, power consumption of the bias circuit 151 can be reduced.

The transistors included in the bias circuit 151 and the clock generation portion 152 are preferably transistors in each of which silicon (Si) is used for a semiconductor layer to be a channel formation region. With such a structure, the amount of current flowing in the transistors can be increased, achieving high-speed circuit operation.

Figure 7:
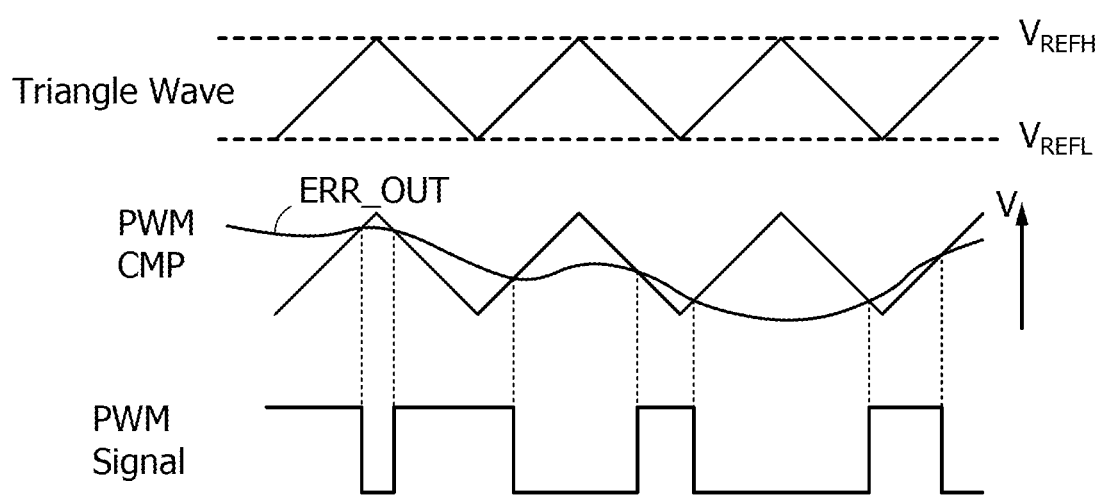
FIG. 7 shows waveforms according to one embodiment of the present invention.

Next, the operation of the comparator 106 is described with reference to FIG. 7. FIG. 7 shows a waveform of a triangle wave (Triangle Wave), waveforms of a triangle wave and an output signal (ERR_OUT) of the error amplifier which are overlapped, and a waveform of a pulse width control signal output from the comparator 106.

The triangle wave output from the clock generation circuit 104 represents a signal that periodically rises to the reference voltage $V_{REFH}$ and falls to the reference voltage $V_{REFL}$. The reference $V_{REFH}$ and the reference voltage $V_{REFL}$ are voltages described using FIG. 6. The waveform of the signal output from the error amplifier and input to the comparator 106 changes continuously in accordance with a feedback signal that changes in a manner similar to that of the output voltage Vout. Thus, the output signal of the error amplifier also has a waveform that changes continuously.

In the comparator 106, a square wave to be a pulse width control signal can be generated using the magnitude relation between the two signals. With the pulse width control signal, on or off of the transistor serving as a switch included in the voltage converter circuit 200 can be controlled. By the control of the on or off of the transistor, the output voltage Vout can be made constant. For example, when the output voltage Vout changes, the waveform of the output signal of the error amplifier changes in accordance with the feedback signal, and the pulse width control signal changes accordingly; thus, the output voltage Vout can be made constant.

Figure 8:
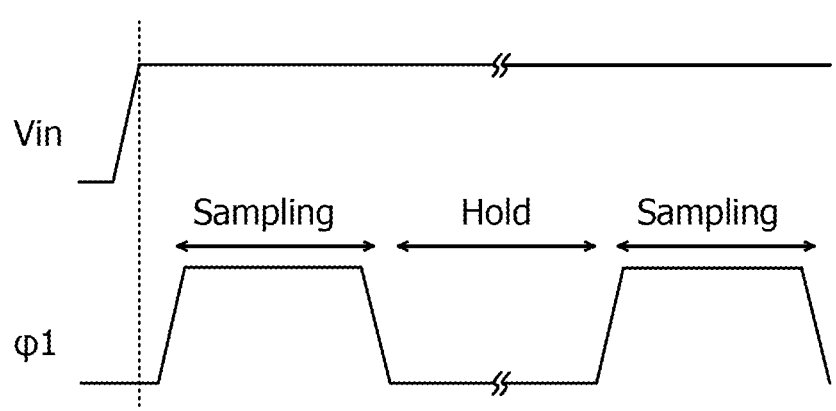
FIG. 8 shows waveforms according to one embodiment of the present invention.

Next, control of the switch using the timer 107 is described with reference to FIG. 8. FIG. 8 shows change in input voltage Vin and a signal waveform of the mode switching signal φ1.

In the control circuit 100 of the DCDC converter 10 in this embodiment, switching between the first mode and the second mode is conducted with the use of the mode switching signal φ1 as described above. By the switching between the first mode and the second mode, a constant potential generated in the bias circuit provided in each of the clock generation circuit, the error amplifier, and the comparison circuit can be intermittently held in the potential hold portion.

Specifically, as shown in FIG. 8, with rising of the input voltage Vin, the mode switching signal φ1 is changed to select the first mode (sampling mode). Then, the mode switching signal φ1 is changed to select the second mode (hold mode). After a lapse of a specified period of time measured by the timer 107, the mode switching signal φ1 is switched so that the first mode is selected again. In this manner, switching between the first mode and the second mode is repeated.

The first mode and the second mode are alternately switched using the timer 107 included in the control circuit 100. Thus, power consumption of the circuits included in the control circuit 100 can be reduced. Specifically, a structure is employed in which the supply of power to the bias circuit 121, the bias circuit 131, the bias circuit 141, and the bias circuit 151 in the clock generation circuit 104, the error amplifier 105, and the comparator 106 is stopped in the second mode. With such a structure, current is prevented from flowing in the bias circuits in the second mode, and power consumption can be reduced accordingly.

Note that in the structure of this embodiment, the performance of the clock generation circuit 104, the error amplifier 105, and the comparator 106 is not reduced even when the supply of power to the bias circuit 121, the bias circuit 131, the bias circuit 141, and the bias circuit 151 in the clock generation circuit 104, the error amplifier 105, and the comparator 106 is stopped intermittently. Specifically, in the second mode, the constant potentials obtained in the bias circuit 121, the bias circuit 131, the bias circuit 141, and the bias circuit 151 can be held at the nodes to each of which the switch and the capacitor are connected, in the potential hold portions 123A to 123C, the potential hold portions 133A to 133D, the potential hold portions 143A to 143D, and the potential hold portions 153A to 153D. The stop of power supply to the bias circuits does not affect signals output from the amplifier circuit 122, the voltage amplifier circuit 132, the comparison circuit 142, and the clock generation portion 152, which operate using the constant potentials. Thus, in the second mode, the DCDC converter 10 can be operated without a reduction in performance.

Furthermore, the following structure is effective: in the second mode, control is performed so that the supply of power to the band gap reference circuit 101, the reference voltage generation circuit 102, and the reference bias generation circuit 103 is stopped. With such a structure, a current is intermittently prevented from flowing in the band gap reference circuit 101, the reference voltage generation circuit 102, and the reference bias generation circuit 103 in the second mode, and accordingly, power consumption can be reduced.

One embodiment of the present invention described above can provide a DCDC converter which is capable of achieving low power consumption and operating without a reduction in performance even when the supply of power to some of the circuits included in the DCDC converter is stopped.

This embodiment can be implemented in appropriate combination with any of the other embodiments and the like.

(Embodiment 2)

In this embodiment, a specific example of the voltage converter circuit 200 in Embodiment 1 is described. Description below is made with reference to FIGS. 9A and 9B and FIGS. 10A and 10B.

Figure 9A:
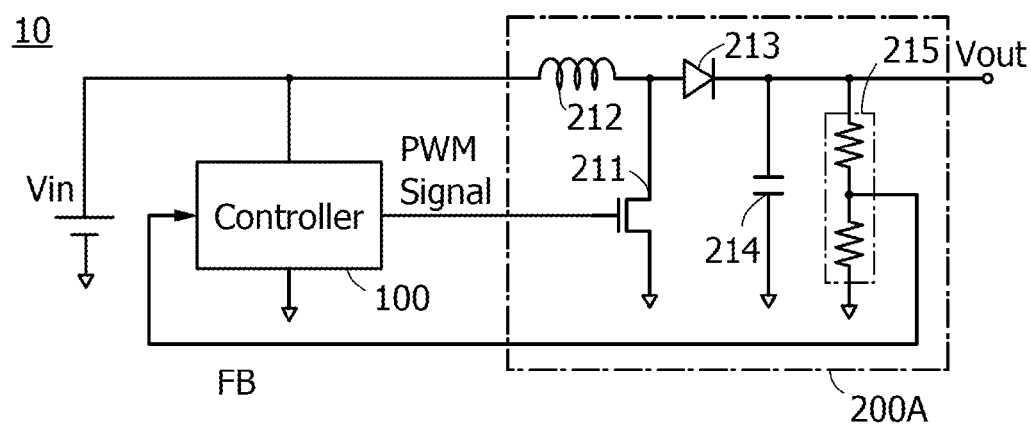
FIGS. 9A and 9B are each a circuit diagram according to one embodiment of the present invention.

FIG. 9A is a block diagram illustrating an example of a structure in which a non-isolated step-up choke type voltage converter circuit 200A is used in the structure of the DCDC converter 10 illustrated in FIG. 1A.

The voltage converter circuit 200A illustrated in FIG. 9A includes a transistor 211 serving as a switch, a coil 212, a diode 213, a capacitor 214, and resistors 215 connected in series.

The transistor 211 controls electrical connection between a node located between the coil 212 and the diode 213 and a fixed potential (e.g., ground potential). Specifically, one of a source and a drain of the transistor 211 is connected to the node between the coil 212 and the diode 213, and the other of the source and the drain thereof is connected to the fixed potential.

One terminal of the coil 212 is supplied with the input voltage Vin, and the other terminal thereof is connected to one electrode of the diode 213.

The other electrode of the diode 213 is connected to a terminal to which the output voltage Vout is applied.

One electrode of the capacitor 214 is connected to the terminal to which the output voltage Vout is applied, and the other electrode thereof is connected to the fixed potential.

The resistors 215 are provided so that resistor division occurs between the terminal to which the output voltage Vout is applied and the terminal to which the fixed potential is applied. A voltage obtained by the resistor division is applied to the control circuit 100 as a feedback signal.

In the voltage converter circuit 200A illustrated in FIG. 9A, when a period in which the transistor 211 is on is longer than a period in which the transistor 211 is off, a high current flows in the coil 212, and a voltage can be stepped up so that the difference between the output voltage Vout and the input voltage Vin is increased. Alternatively, when the period in which the transistor 211 is off is longer than the period in which the transistor 211 is on, a low current flows in the coil 212, and a voltage can be stepped up so that the difference between the output voltage Vout and the input voltage Vin is decreased.

Figure 9B:
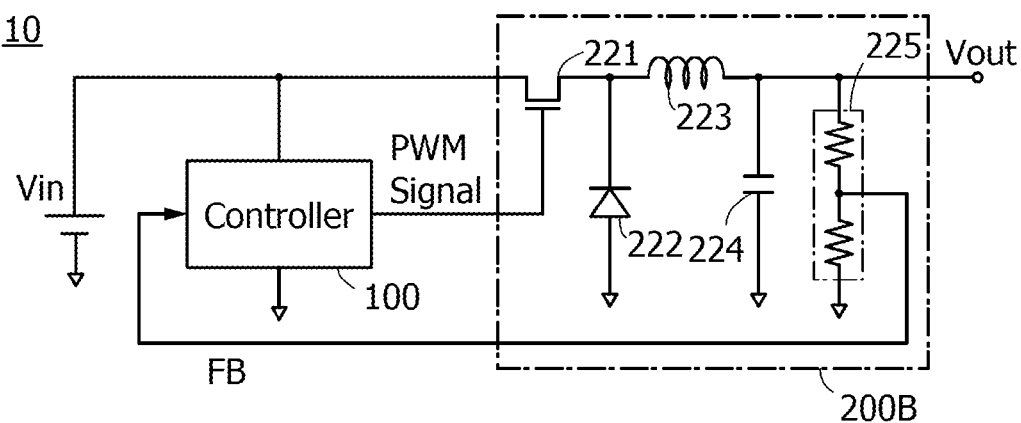

FIG. 9B is a block diagram illustrating an example of a structure using a non-isolated step-down choke type voltage converter circuit 200B in the structure of the DCDC converter 10 illustrated in FIG. 1A.

The voltage converter circuit 200B illustrated in FIG. 9B includes a transistor 221 serving as a switch, a diode 222, a coil 223, a capacitor 224, and resistors 225 connected in series.

The transistor 221 controls electrical connection between a node to which the input voltage Vin is applied and a node between the diode 222 and the coil 223. Specifically, one of a source and a drain of the transistor 221 is connected to a terminal to which the input voltage Vin is applied, and the other of the source and the drain thereof is connected to the node between the diode 222 and the coil 223.

One electrode of the diode 222 is connected to the node between the diode 222 and the coil 223, and the other electrode thereof is connected to a fixed potential.

One terminal of the coil 223 is connected to the node between the diode 222 and the coil 223, and the other terminal thereof is connected to the terminal to which the output voltage Vout is applied.

One electrode of the capacitor 224 is connected to the terminal to which the output voltage Vout is applied, and the other electrode thereof is connected to the fixed potential.

The resistors 225 are provided so that resistor division occurs between the terminal to which the output voltage Vout is applied and the terminal to which the fixed potential is applied. A voltage obtained by the resistor division is applied to the control circuit 100 as a feedback signal.

In the voltage converter circuit 200B illustrated in FIG. 9B, when a period in which the transistor 221 is on is longer than a period in which the transistor 221 is off, a voltage held in the capacitor 224 can be stepped down so as to approach the input voltage Vin. Alternatively, when the period in which the transistor 221 is off is longer than the period in which the transistor 221 is on, a voltage held in the capacitor 224 can be decreased and stepped down.

Figure 10A:
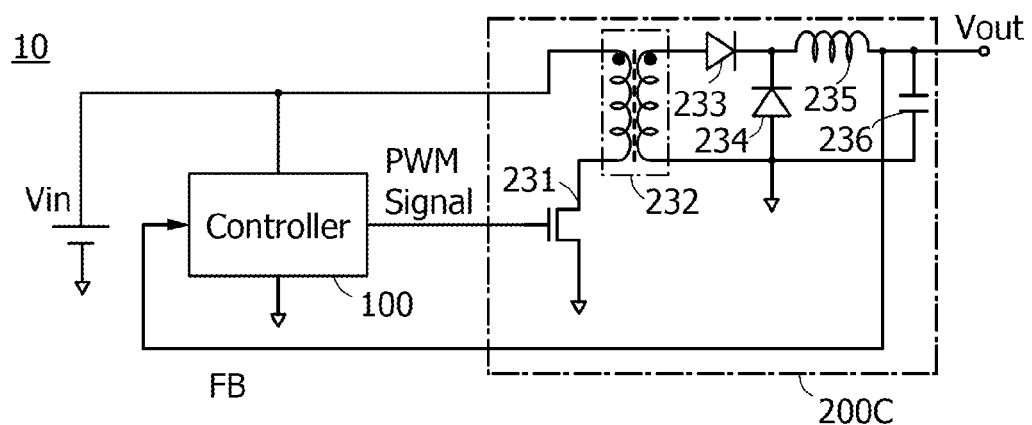
FIGS. 10A and 10B are each a circuit diagram according to one embodiment of the present invention.

FIG. 10A is a block diagram illustrating an example of a structure in which an isolated forward voltage converter circuit 200C is used in the structure of the DCDC converter 10 illustrated in FIG. 1A.

The voltage converter circuit 200C illustrated in FIG. 10A includes a transistor 231 serving as a switch, a transformer 232, a diode 233, a diode 234, a coil 235, and a capacitor 236.

The transistor 231 controls electrical connection between a primary coil of the transformer 232 and a terminal connected to a fixed potential. Specifically, one of a source and a drain of the transistor 231 is connected to the primary coil of the transformer 232, and the other of the source and the drain thereof is connected to the fixed potential.

The transformer 232 includes the primary coil and a secondary coil. The secondary coil of the transformer 232 is connected to one electrode of the diode 233.

The other electrode of the diode 233 is connected to a node between the diode 234 and the coil 235.

One electrode of the diode 234 is connected to a node between the diode 233 and the coil 235. The other electrode of the diode 234 is connected to a terminal connected to the fixed potential.

One terminal of the coil 235 is connected to a node between the diode 233 and the diode 234. The other terminal of the coil 235 is connected to a terminal to which the output voltage Vout is applied.

One electrode of the capacitor 236 is connected to the terminal to which the output voltage Vout is applied. The other electrode of the capacitor 236 is connected to the terminal connected to the fixed potential. The output voltage Vout is applied to the control circuit 100 as a feedback signal.

In the voltage converter circuit 200C illustrated in FIG. 10A, a current flowing in the primary coil is controlled by alternately switching the on or off of the transistor 231 to excite the transformer 232, and the step down of the output voltage Vout on the secondary coil side can be controlled.

Figure 10B:
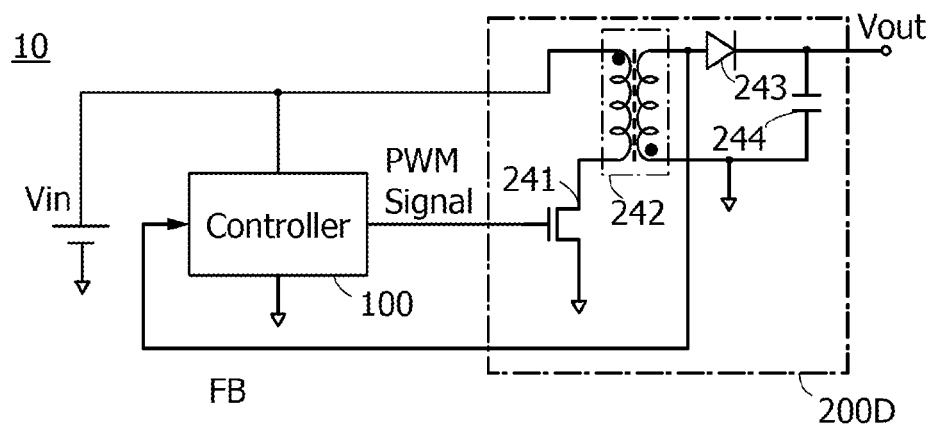

FIG. 10B is a block diagram illustrating an example of a structure using an isolated flyback voltage converter circuit 200D in the structure of the DCDC converter 10 illustrated in FIG. 1A.

The voltage converter circuit 200D illustrated in FIG. 10B includes a transistor 241 serving as a switch, a transformer 242, a diode 243, and a capacitor 244.

The transistor 241 controls electrical connection between a primary coil of the transformer 242 and a terminal connected to a fixed potential. Specifically, one of a source and a drain of the transistor 241 is connected to the primary coil of the transformer 242, and the other of the source and the drain thereof is connected to the fixed potential.

The transformer 242 includes the primary coil and a secondary coil. The secondary coil of the transformer 242 is connected to one electrode of the diode 243.

The other electrode of the diode 243 is connected to a terminal to which the output voltage Vout is applied.

One electrode of the capacitor 244 is connected to the terminal to which the output voltage Vout is applied. The other electrode of the capacitor 244 is connected to a terminal connected to the fixed potential. The output voltage Vout is applied to the control circuit 100 as a feedback signal.

In the voltage converter circuit 200D illustrated in FIG. 10B, a current flowing in the primary coil is converted to a self-induced voltage on the secondary coil side by alternately switching the transistor 241, and the step up of the output voltage Vout on the secondary coil side can be controlled.

In each of the above-described structures including the transistor 211, the transistor 221, the transistor 231, and the transistor 241, only one transistor is provided, but the number of transistors may be two or more. Although an n-channel transistor is shown in the drawings, a p-channel transistor may be used alternatively. A transistor including a semiconductor other than a semiconductor containing silicon may be used; for example, a transistor including an oxide semiconductor or a transistor including a compound semiconductor may be used. A plurality of gate electrodes may be provided; for example, a transistor may be provided with a back gate electrode in addition to a gate electrode. With the structure including the back gate electrode, the off-state current or the on-state resistance of the transistor can be adjusted in accordance with the amount of output power to increase power conversion efficiency.

The voltage converter circuits 200A to 200D illustrated in FIGS. 9A and 9B and FIGS. 10A and 10B are the non-isolated step-up choke type voltage converter circuit, the non-isolated step-down choke type voltage converter circuit, the isolated forward voltage converter circuit, and the isolated flyback voltage converter circuit. However, a half-bridge voltage converter circuit or a full-bridge voltage converter circuit can be used.

The DCDC converters described in this embodiment each have a control circuit with the structure described in Embodiment 1. Thus, the DCDC converters can achieve low power consumption and operate without a reduction in performance even when the supply of power to some of the circuits included in the DCDC converters is stopped.

The structure described above in this embodiment can be combined as appropriate with any of the structures described in the other embodiments.

(Embodiment 3)

In this embodiment, an oxide semiconductor layer that can be used for the semiconductor layer to be a channel formation region of the transistor with low off-state current described in the above embodiment is described.

An oxide semiconductor used for the semiconductor layer to be a channel formation region of the transistor preferably contains at least indium (In) or zinc (Zn). In particular, In and Zn are preferably contained. A stabilizer for strongly bonding oxygen is preferably contained in addition to In and Zn. As a stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor used for the semiconductor layer to be a channel formation region of the transistor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, In:Ga:Zn=3:1:2, or In:Ga:Zn=2:1:3, or an oxide with an atomic ratio close to the above atomic ratios can be used.

When the oxide semiconductor film forming the semiconductor layer to be a channel formation region contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment or treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) or substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1 \times 10^{17}/cm^3$, lower than or equal to $1 \times 10^{16}/cm^3$, lower than or equal to $1 \times 10^{15}/cm^3$, lower than or equal to $1 \times 10^{14}/cm^3$, or lower than or equal to $1 \times 10^{13}/cm^3$.

In this manner, the transistor including an i-type (intrinsic) or substantially i-type oxide semiconductor film can have extremely favorable off-state current characteristics. For example, the drain current at the time when the transistor including an oxide semiconductor film is in an off-state at room temperature (approximately 25° C.) can be less than or equal to $1 \times 10^{-18}$ A, preferably less than or equal to $1 \times 10^{-21}$ A, and more preferably $1 \times 10^{-24}$ A; or at 85° C., less than or equal to $1 \times 10^{-15}$ A, preferably $1 \times 10^{-18}$ A, more preferably less than or equal to $1 \times 10^{-21}$ A. An off state of a transistor refers to a state where a gate voltage is much lower than the threshold voltage in an n-channel transistor. Specifically, when the gate voltage is lower than the threshold voltage by 1 V or more, 2 V or more, or 3 V or more, the transistor is off.

An oxide semiconductor which is formed may include a non-single-crystal, for example. The non-single-crystal is, for example, structured by at least one of c-axis aligned crystal (CAAC), polycrystal, microcrystal, and an amorphous part.

An oxide semiconductor may include CAAC, for example. Note that an oxide semiconductor including CAAC is referred to as a CAAC-OS (c-axis aligned crystalline oxide semiconductor).

In an image obtained with a transmission electron microscope (TEM), for example, crystal parts can be found in the CAAC-OS in some cases. In most cases, in an image obtained with a TEM, crystal parts in the CAAC-OS each fit inside a cube whose one side is less than 100 nm, for example. In an image obtained with a TEM, a boundary between the crystal parts in the CAAC-OS is not clearly observed in some cases. Further, in an image obtained with a TEM, a grain boundary in the CAAC-OS is not clearly observed in some cases. In the CAAC-OS, since a clear grain boundary does not exist, for example, segregation of an impurity is unlikely to occur. In the CAAC-OS, since a clear boundary does not exist, for example, high density of defect states is unlikely to occur. In the CAAC-OS, since a clear grain boundary does not exist, for example, a reduction in electron mobility is unlikely to occur.

For example, the CAAC-OS sometimes includes a plurality of crystal parts in which c-axes are aligned in a direction parallel to a normal vector of a surface where the CAAC-OS is formed or a normal vector of a surface of the CAAC-OS. When the CAAC-OS is analyzed by an out-of-plane method with an X-ray diffraction (XRD) apparatus, a peak at 2θ of around 31 degrees which shows alignment appears in some cases. Further, for example, spots (luminescent spots) are observed in an electron diffraction pattern of the CAAC-OS in some cases. An electron diffraction pattern obtained with an electron beam having a beam diameter of 10 nm or smaller, or 5 nm or smaller, is called a nanobeam electron diffraction pattern. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states for example. In an oxide semiconductor, for example, oxygen vacancies are defect states. The oxygen vacancies serve as trap levels or serve as carrier generation sources when hydrogen is trapped therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has a low density of trap states in some cases. Thus, the transistor including the oxide semiconductor in the channel formation region has a small variation in electrical characteristics and high reliability in some cases. Charges trapped by the trap states in the oxide semiconductor take a long time to be released and may behave like fixed charges. Thus, the transistor which includes the oxide semiconductor having a high density of trap states in the channel formation region has unstable electrical characteristics in some cases.

A transistor including the highly purified intrinsic or substantially highly purified intrinsic CAAC-OS has a small variation in the electrical characteristics due to irradiation with visible light or ultraviolet light.

An oxide semiconductor may include polycrystal, for example. Note that an oxide semiconductor including polycrystal is referred to as a polycrystalline oxide semiconductor. A polycrystalline oxide semiconductor includes a plurality of crystal grains.

An oxide semiconductor may include microcrystal, for example. Note that an oxide semiconductor including microcrystal is referred to as a microcrystalline oxide semiconductor.

In an image obtained with a TEM, for example, crystal parts cannot be found clearly in the microcrystalline oxide semiconductor in some cases. In most cases, the size of a crystal part included in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as a nanocrystalline oxide semiconductor (nc-OS). In an image of the nc-OS obtained with a TEM, for example, a boundary between crystal parts is not clearly detected in some cases. In an image of the nc-OS obtained with a TEM, for example, since a clear grain boundary does not exist, for example, segregation of an impurity is unlikely to occur. In the nc-OS, since a clear grain boundary does not exist, for example, high density of defect states is unlikely to occur. In the nc-OS, since a clear grain boundary does not exist, for example, a reduction in electron mobility is unlikely to occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed macroscopically or a case where long-range order in atomic arrangement is not observed. Accordingly, in some cases, the nc-OS cannot be distinguished from an amorphous oxide semiconductor, for example, depending on an analysis method. When the nc-OS is analyzed by an out-of-plane method with an XRD apparatus using an X-ray having a beam diameter larger than the diameter of a crystal part, a peak which shows alignment does not appear in some cases. Further, for example, a halo pattern is shown in some cases in an electron diffraction pattern of the nc-OS obtained by using an electron beam having a beam diameter larger than the diameter of a crystal part (e.g., a beam diameter of 20 nmϕ or more, or 50 nmϕ or more). For example, spots are shown in some cases in a nanobeam electron diffraction pattern of the nc-OS obtained by using an electron beam having a beam diameter smaller than or equal to the diameter of a crystal part (e.g., a beam diameter of 10 nmϕ or less, or 5 nmϕ or less). In a nanobeam electron diffraction pattern of the nc-OS, for example, regions with high luminance in a circular pattern are shown in some cases. In a nanobeam electron diffraction pattern of the nc-OS, for example, a plurality of spots is shown in the region in some cases.

Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

This embodiment can be implemented in appropriate combination with any of the other embodiments and the like.

(Embodiment 4)

In this embodiment, a cross-sectional structure of transistors included in the DCDC converter according to one embodiment of the disclosed invention is described with reference to a drawing.

The transistors included in the DCDC converter can be an OS transistor in the potential hold portion and a transistor containing silicon (Si) in a semiconductor layer to be a channel formation region that is used as a transistor in the control circuit 100. The transistor containing silicon is hereinafter referred to as Si transistor.

This embodiment specifically illustrates an example of a cross-sectional structure where an OS transistor and a capacitor that form the potential hold portion and an Si transistor are stacked, with reference to the drawing. FIG. 11 shows the cross-sectional structure of a transistor SiTr, a transistor OSTr, and a capacitor Cp as the Si transistor, the OS transistor, and the capacitor, respectively.

In this embodiment, the transistor SiTr is formed in a single crystal silicon substrate, and the transistor OSTr including an oxide semiconductor layer is formed over the transistor SiTr. The transistor SiTr may include a thin semiconductor layer of silicon, germanium, or the like in an amorphous, microcrystalline, polycrystalline, or single crystal state.

In the case where the transistor SiTr is formed using a thin silicon film, any of the following can be used: amorphous silicon formed by a sputtering method or a vapor phase growth method such as a plasma CVD method; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

Note that in the control circuit 100 of the DCDC converter 10 described in Embodiment 1, the number of the OS transistors is smaller than the number of the Si transistors. Thus, a stack of the transistor OSTr over the transistor SiTr leads to more flexible design rule of the transistor OSTr.

With the above-described structure in which the Si transistor and the OS transistor are stacked, the chip area of the control circuit 100 of the DCDC converter 10 can be reduced. Because the number of the Si transistors is larger than the number of the OS transistors in one circuit block, an actual chip area depends on the number of the Si transistors.

In FIG. 11, the n-channel transistor SiTr is formed in a semiconductor substrate 800.

The semiconductor substrate 800 can be, for example, a silicon substrate having n-type or p-type conductivity, a germanium substrate, a silicon germanium substrate, a compound semiconductor substrate (e.g., a GaAs substrate, an InP substrate, a GaN substrate, a SiC substrate, a GaP substrate, a GaInAsP substrate, or a ZnSe substrate), or the like.

The transistor SiTr is electrically isolated from the other transistors by an element isolation insulating film 801. The element isolation insulating film 801 can be formed by a local oxidation of silicon (LOCOS) method, a trench isolation method, or the like.

Specifically, the transistor SiTr includes impurity regions 802 and 803 that are formed in the semiconductor substrate 800 and function as a source region and a drain region, a gate electrode 804, and a gate insulating film 805 provided between the semiconductor substrate 800 and the gate electrode 804. The gate electrode 804 overlaps with a channel formation region formed between the impurity regions 802 and 803 with the gate insulating film 805 positioned between the gate electrode 804 and the channel formation region.

An insulating film 809 is provided over the transistor SiTr. Openings are formed in the insulating film 809. Wirings 810 and 811 that are in contact with the impurity regions 802 and 803, respectively, and a wiring 812 that is in contact with the gate electrode 804 is formed in the openings.

The wiring 810 is connected to a wiring 815 formed over the insulating film 809. The wiring 811 is connected to a wiring 816 formed over the insulating film 809. The wiring 812 is connected to a wiring 817 formed over the insulating film 809.

An insulating film 820 is formed over the wirings 815 to 817. An opening is formed in the insulating film 820. In the opening, a wiring 821 that is connected to the wiring 817 is formed.

In FIG. 11, the transistor OSTr and the capacitor Cp are formed over the insulating film 820.

The transistor OSTr includes, over the insulating film 820, a semiconductor film 830 including an oxide semiconductor, conductive films 832 and 833 that are positioned over the semiconductor film 830 and function as a source electrode and a drain electrode, a gate insulating film 831 over the semiconductor film 830 and the conductive films 832 and 833, and a gate electrode 834 that is positioned over the gate insulating film 831 and overlaps with the semiconductor film 830 between the conductive films 832 and 833. Note that the conductive film 833 is connected to the wiring 821.

A conductive film 835 is provided over the gate insulating film 831 to overlap with the conductive film 833. A portion where the conductive film 835 overlaps with the conductive film 833 with the gate insulating film 831 placed therebetween functions as the capacitor Cp.

Note that in FIG. 11, the capacitor Cp is provided over the insulating film 820 together with the transistor OSTr. However, the capacitor Cp may be provided below the insulating film 820 together with the transistor SiTr.

An insulating film 841 is provided over the transistor OSTr and the capacitor Cp. An opening is provided in the insulating film 841. Over the insulating film 841, a conductive film 843 that is in contact with the gate electrode 834 in the opening is provided.

Note that in FIG. 11, the transistor OSTr includes the gate electrode 834 on at least one side of the semiconductor film 830. Alternatively, the transistor OSTr may include a pair of gate electrodes with the semiconductor film 830 positioned therebetween.

When the transistor OSTr includes a pair of gate electrodes with the semiconductor film 830 positioned therebetween, a signal for controlling on/off may be supplied to one of the gate electrodes, and the other of the gate electrodes may be supplied with a potential from another element. In the latter case, potentials with the same level may be supplied to the pair of gate electrodes, or a fixed potential such as a ground potential may be supplied only to the other of the gate electrodes. When the level of a potential supplied to the other of the gate electrodes is controlled, the threshold voltage of the transistor OSTr can be controlled.

The semiconductor film 830 is not limited to a single oxide semiconductor film and may have a structure including a plurality of oxide semiconductor films which are stacked.

This embodiment can be implemented in appropriate combination with any of the other embodiments and the like.

(Embodiment 5)

In this embodiment, examples of electronic devices each including the DCDC converter described in any of the above embodiments are described. Examples of the electronic devices include computers, portable information terminals (including mobile phones, portable game machines, audio reproducing devices, and the like), electronic paper, television devices (also referred to as televisions or television receivers), and digital video cameras.

Figure 12A:
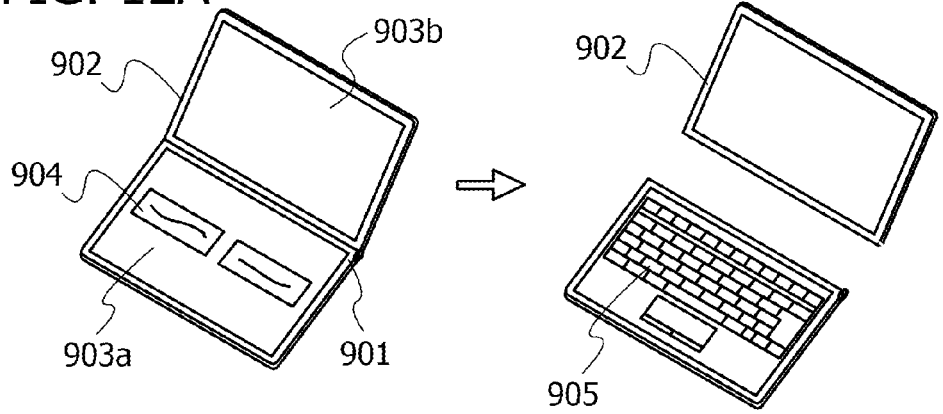
FIGS. 12A to 12E show electronic devices each including a DCDC converter.

FIG. 12A illustrates a portable information terminal, which includes a housing 901, a housing 902, a first display portion 903a, a second display portion 903b, and the like. The DCDC converter described in any of the above embodiments is provided inside at least part of the housings 901 and 902. Thus, the portable information terminal can achieve low power consumption and operate without a reduction in performance even when the supply of power to some of the circuits included in the DCDC converter is stopped.

Note that the first display portion 903a is a touch panel, and for example, as illustrated in the left of FIG. 12A, which of "touch input" and "keyboard input" is performed can be selected by a selection button 904 displayed on the first display portion 903a. Since the selection buttons with a variety of sizes can be displayed, the portable information terminal can be easily used by people of any generation. In the case where "keyboard input" is selected, for example, a keyboard 905 is displayed on the first display portion 903a as illustrated in the right of FIG. 12A. With such a structure, letters can be input quickly by keyboard input as in the case of using a conventional information terminal, for example.

Further, one of the first display portion 903a and the second display portion 903b can be detached from the portable information terminal as illustrated in the right of FIG. 12A. The second display portion 903b can also function as a touch panel for a reduction in weight to carry around to be operated by one hand while the other hand supports the housing 902, which is convenient.

The portable information terminal illustrated in FIG. 12A can have a function of displaying a variety of information (e.g., a still image, a moving image, and a text image) on the display portion, a function of displaying a calendar, a date, the time, or the like on the display portion, a function of operating or editing information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 12A may transmit and receive data wirelessly. Through wireless communication, desired book data or the like can be purchased and downloaded from an e-book server.

Further, the housing 902 illustrated in FIG. 12A may have an antenna, a microphone function, or a wireless communication function to be used as a cellular phone.

Figure 12B:
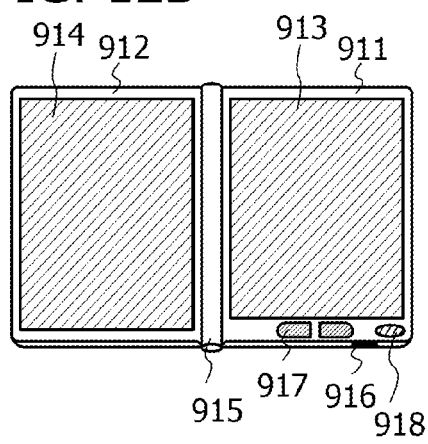

FIG. 12B illustrates an electronic book reader in which electronic paper is incorporated. The electronic book reader has two housings of a housing 911 and a housing 912. The housing 911 and the housing 912 are provided with a display portion 913 and a display portion 914, respectively. The housings 911 and 912 are connected by a hinge portion 915 and can be opened or closed with the hinge portion 915 as an axis. The housing 911 is provided with a power switch 916, an operation key 917, a speaker 918, and the like. At least one of the housing 911 and the housing 912 is provided with the DCDC converter described in any of the above embodiments. Thus, the electronic book can achieve low power consumption and operate without a reduction in performance even when the supply of power to some of the circuits included in the DCDC converter is stopped.

Figure 12C:
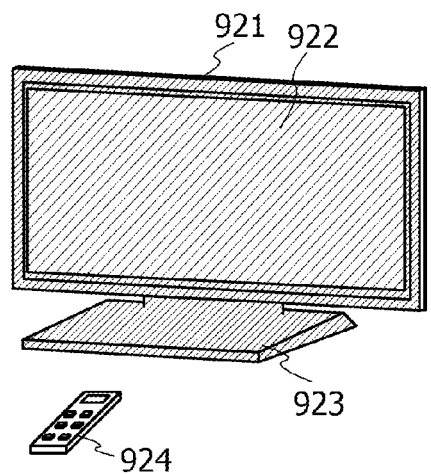

FIG. 12C is a television device, which includes a housing 921, a display portion 922, a stand 923, and the like. The television device can be operated with a switch of the housing 921 and a separate remote controller 924. The DCDC converter described in any of the above embodiments is provided in the housing 921 and the remote controller 924. Thus, the television device can achieve low power consumption and operate without a reduction in performance even when the supply of power to some of the circuits included in the DCDC converter is stopped.

Figure 12D:
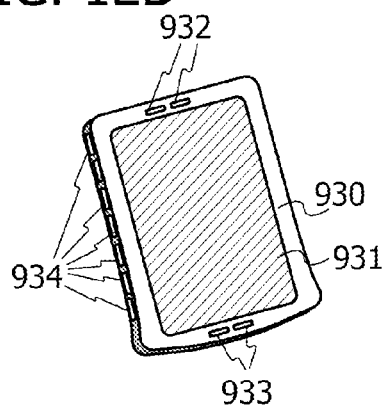

FIG. 12D illustrates a smartphone in which a main body 930 includes a display portion 931, a speaker 932, a microphone 933, operation buttons 934, and the like. The DCDC converter described in any of the above embodiments is provided in the main body 930. Thus, the smartphone can achieve low power consumption and operate without a reduction in performance even when the supply of power to some of the circuits included in the DCDC converter is stopped.

Figure 12E:
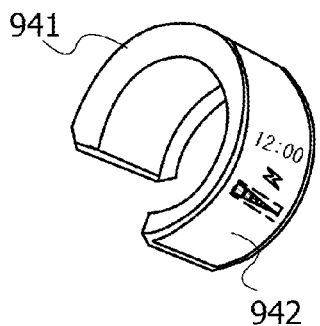

FIG. 12E is a wrist watch type display device including a main body 941, a display portion 942, and the like. The DCDC converter described in any of the above embodiments is provided in the main body 941. Thus, the wrist watch type display device can achieve low power consumption and operate without a reduction in performance even when the supply of power to some of the circuits included in the DCDC converter is stopped.

As described above, the DCDC converter described in any of the above embodiments is provided for each of the electronic devices described in this embodiment. Thus, the electronic devices can achieve low power consumption and operate without a reduction in performance even when the supply of power to some of the circuits included in the DCDC converter is stopped.

This application is based on Japanese Patent Application serial no. 2013-155112 filed with Japan Patent Office on Jul. 26, 2013, the entire contents of which are hereby incorporated by reference.

What is claimed is:

1. A DCDC converter comprising:
a clock generation circuit configured to output a triangle wave;
an error amplifier configured to output an error signal;
a comparator configured to output a control signal in accordance with the triangle wave and the error signal; and
a timer configured to output a switching signal,
wherein each of the clock generation circuit, the error amplifier, and the comparator comprises:
a bias circuit configured to output a bias voltage;
a capacitor; and
a transistor, one of a source and a drain of the transistor being electrically connected to the bias circuit, and the other of the source and the drain of the transistor being electrically connected to the capacitor, and
wherein in each of the clock generation circuit, the error amplifier, and the comparator, the capacitor is configured to hold the bias voltage intermittently in accordance with the switching signal supplied to a gate of the transistor.

2. The DCDC converter according to claim 1,
wherein in each of the clock generation circuit, the error amplifier, and the comparator, supply of power supply to the bias circuit is stopped when the capacitor holds the bias voltage.

3. The DCDC converter according to claim 1,
wherein in each of the clock generation circuit, the error amplifier, and the comparator, the supply of power supply to the bias circuit is stopped in accordance with the switching signal supplied to a power switch.

4. The DCDC converter according to claim 1,
wherein the clock generation circuit is configured to output a clock signal, and
wherein the timer is configured to output the switching signal periodically in accordance with the clock signal.

5. The DCDC converter according to claim 1,
wherein the other of the source and the drain of the transistor of the clock generation circuit is electrically connected to a clock generation portion,
wherein the other of the source and the drain of the transistor of the error amplifier is electrically connected to an amplifier circuit, and
wherein the other of the source and the drain of the transistor of the comparator is electrically connected to a comparison circuit.

6. The DCDC converter according to claim 1, further comprising:
a band gap reference circuit configured to output a first reference voltage;
a reference voltage generation circuit configured to output a second reference voltage in accordance with the first reference voltage; and
a reference bias generation circuit configured to output a bias current in accordance with the first reference voltage,
wherein supply of an input voltage to each of the band gap reference circuit, the reference bias generation circuit and the reference voltage generation circuit is stopped in accordance with the switching signal.

7. The DCDC converter according to claim 1, further comprising a voltage converter circuit configured to output an output voltage in accordance with the control signal.

8. The DCDC converter according to claim 1, further comprising a voltage converter circuit configured to output an output voltage in accordance with the control signal, wherein the voltage converter circuit comprises at least one of a coil, a diode, a resistor, and a transformer.

9. A DCDC converter comprising:
a clock generation circuit configured to output a triangle wave;
an error amplifier configured to output an error signal;
a comparator configured to output a control signal in accordance with the triangle wave and the error signal; and
a timer configured to output a switching signal,
wherein each of the clock generation circuit, the error amplifier, and the comparator comprises:
a bias circuit configured to output a bias voltage;
a capacitor; and
a transistor, one of a source and a drain of the transistor being electrically connected to the bias circuit, and the other of the source and the drain of the transistor being electrically connected to the capacitor,
wherein in each of the clock generation circuit, the error amplifier, and the comparator, the capacitor is configured to hold the bias voltage intermittently in accordance with the switching signal supplied to a gate of the transistor, and
wherein a channel formation region of the transistor of each of the clock generation circuit, the error amplifier, and the comparator comprises an oxide semiconductor layer.

10. The DCDC converter according to claim 9,
wherein in each of the clock generation circuit, the error amplifier, and the comparator, supply of power supply to the bias circuit is stopped when the capacitor holds the bias voltage.

11. The DCDC converter according to claim 9,
wherein in each of the clock generation circuit, the error amplifier, and the comparator, the supply of power supply to the bias circuit is stopped in accordance with the switching signal supplied to a power switch.

12. The DCDC converter according to claim 9,
wherein the clock generation circuit is configured to output a clock signal, and
wherein the timer is configured to output the switching signal periodically in accordance with the clock signal.

13. The DCDC converter according to claim 9,
wherein the other of the source and the drain of the transistor of the clock generation circuit is electrically connected to a clock generation portion,
wherein the other of the source and the drain of the transistor of the error amplifier is electrically connected to an amplifier circuit, and
wherein the other of the source and the drain of the transistor of the comparator is electrically connected to a comparison circuit.

14. The DCDC converter according to claim 9, further comprising:
a band gap reference circuit configured to output a first reference voltage;
a reference voltage generation circuit configured to output a second reference voltage in accordance with the first reference voltage; and
a reference bias generation circuit configured to output a bias current in accordance with the first reference voltage,
wherein supply of an input voltage to each of the band gap reference circuit, the reference bias generation circuit and the reference voltage generation circuit is stopped in accordance with the switching signal.

15. The DCDC converter according to claim 9, further comprising a voltage converter circuit configured to output an output voltage in accordance with the control signal.

16. The DCDC converter according to claim 9, further comprising a voltage converter circuit configured to output an output voltage in accordance with the control signal,
wherein the voltage converter circuit comprises at least one of a coil, a diode, a resistor, and a transformer.

17. The DCDC converter according to claim 9, wherein an off current per micrometer of a channel width of the transistor of each of the clock generation circuit, the error amplifier, and the comparator is lower than or equal to 10 zA/μm at room temperature.

* * * * *